United States Patent
Shin et al.

(10) Patent No.: US 11,349,454 B2
(45) Date of Patent: May 31, 2022

(54) ACOUSTIC WAVE DEVICES WITH COMMON GLASS SUBSTRATE

(71) Applicant: Skyworks Global Pte. Ltd., Singapore (SG)

(72) Inventors: Kwang Jae Shin, Yongin-si (KR); Hiroyuki Nakamura, Osaka-Fu (JP)

(73) Assignee: SKYWORKS GLOBAL PTE. LTD., Singapore (SG)

( * ) Notice: Subject to any disclaimer, the term of this patent is extended or adjusted under 35 U.S.C. 154(b) by 85 days.

(21) Appl. No.: 16/726,058

(22) Filed: Dec. 23, 2019

(65) Prior Publication Data

US 2020/0212882 A1   Jul. 2, 2020

Related U.S. Application Data

(60) Provisional application No. 62/785,906, filed on Dec. 28, 2018, provisional application No. 62/785,958, filed on Dec. 28, 2018.

(51) Int. Cl.
| | | |
|---|---|---|
| *H03H 9/54* | (2006.01) | |
| *H03H 9/64* | (2006.01) | |
| *H03H 9/70* | (2006.01) | |
| *H03H 9/56* | (2006.01) | |
| *H03H 9/17* | (2006.01) | |
| *H03H 9/13* | (2006.01) | |

(Continued)

(52) U.S. Cl.
CPC ........... *H03H 9/56* (2013.01); *H03H 9/13* (2013.01); *H03H 9/145* (2013.01); *H03H 9/17* (2013.01); *H03H 9/171* (2013.01); *H03H 9/25* (2013.01); *H03H 9/54* (2013.01); *H03H 9/64* (2013.01); *H03H 9/703* (2013.01); *H03H 9/72* (2013.01)

(58) Field of Classification Search
CPC ....... H03H 9/54; H03H 9/64; H03H 9/70–725
See application file for complete search history.

(56) References Cited

U.S. PATENT DOCUMENTS

| | | |
|---|---|---|
| 3,996,535 A | 12/1976 | Turski |
| 5,233,259 A | 8/1993 | Krishnaswamy et al. |

(Continued)

FOREIGN PATENT DOCUMENTS

| | | |
|---|---|---|
| JP | 2011-066818 A | 3/2011 |
| JP | 2020-109958 | 7/2020 |

OTHER PUBLICATIONS

Resistivity stability in high resistivity MCz material, Thermal donors, Okmetic (Jan. 28, 2016).

(Continued)

*Primary Examiner* — Dean O Takaoka
*Assistant Examiner* — Alan Wong
(74) *Attorney, Agent, or Firm* — Knobbe, Martens, Olson & Bear, LLP

(57) ABSTRACT

An acoustic wave component is disclosed. The acoustic wave component can include a bulk acoustic wave resonator and a surface acoustic wave device. The bulk acoustic wave resonator can include a first portion of a glass substrate, a first piezoelectric layer positioned on the glass substrate, and electrodes positioned on opposing sides of the first piezoelectric layer. The surface acoustic wave device can include a second portion of the glass substrate, a second piezoelectric layer positioned on the glass substrate, and an interdigital transducer electrode on the second piezoelectric layer.

20 Claims, 20 Drawing Sheets

(51) Int. Cl.
*H03H 9/145* (2006.01)
*H03H 9/25* (2006.01)
*H03H 9/72* (2006.01)

(56) References Cited

U.S. PATENT DOCUMENTS

| | | | |
|---|---|---|---|
| 6,741,145 B2 | 5/2004 | Tikka et al. | |
| 7,280,007 B2* | 10/2007 | Feng | H03H 9/02118 |
| | | | 333/187 |
| 8,164,398 B2* | 4/2012 | Taniguchi | H03H 9/587 |
| | | | 333/133 |
| 9,219,467 B2* | 12/2015 | Inoue | H03H 9/725 |
| 9,246,533 B2 | 1/2016 | Fujiwara et al. | |
| 9,520,857 B2 | 12/2016 | Fujiwara et al. | |
| 9,680,083 B2 | 6/2017 | Hori et al. | |
| 9,742,377 B2* | 8/2017 | Iwaki | H03H 9/54 |
| 10,249,812 B2 | 4/2019 | Satoh | |
| 10,559,741 B2* | 2/2020 | Bulger | H03H 9/0538 |
| 10,659,003 B2* | 5/2020 | Nakazawa | H03H 9/02834 |
| 2004/0100164 A1 | 5/2004 | Murata et al. | |
| 2007/0188270 A1 | 8/2007 | Ohara et al. | |
| 2012/0231218 A1 | 9/2012 | Nakayama et al. | |
| 2013/0271238 A1* | 10/2013 | Onda | H03H 9/0571 |
| | | | 333/133 |
| 2015/0325775 A1 | 11/2015 | Shimizu | |
| 2016/0118958 A1 | 4/2016 | Burak et al. | |
| 2017/0201227 A1 | 7/2017 | Shimizu | |
| 2017/0288121 A1 | 10/2017 | Burak et al. | |
| 2017/0339798 A1 | 11/2017 | Wang et al. | |
| 2018/0102760 A1 | 4/2018 | Inoue et al. | |
| 2018/0175275 A1 | 6/2018 | Nishihara et al. | |
| 2018/0277527 A1 | 9/2018 | Yota et al. | |
| 2018/0294794 A1 | 10/2018 | Liu et al. | |
| 2020/0212878 A1 | 7/2020 | Shin et al. | |
| 2020/0212884 A1* | 7/2020 | Shin | H03H 9/145 |
| 2021/0203305 A1* | 7/2021 | Maki | H03H 9/173 |

OTHER PUBLICATIONS

Shim et al., "RF MEMS Passives on High-Resistivity Silicon Substrates", IEEE Microwave and Wireless Components Letters (2013).

* cited by examiner

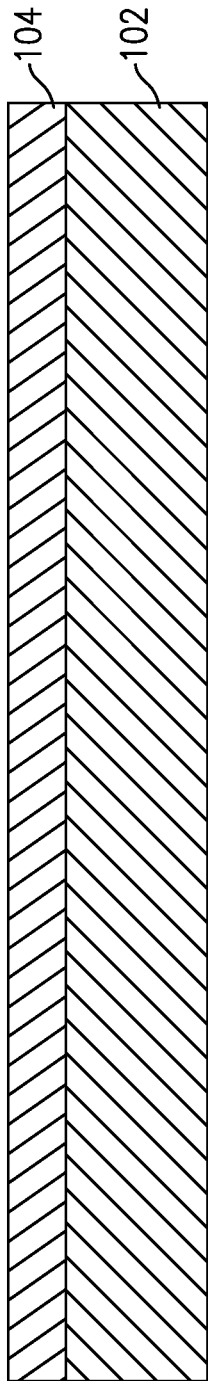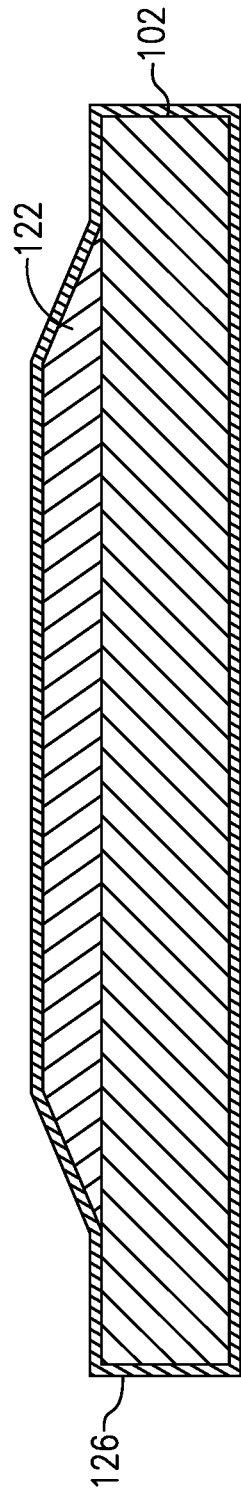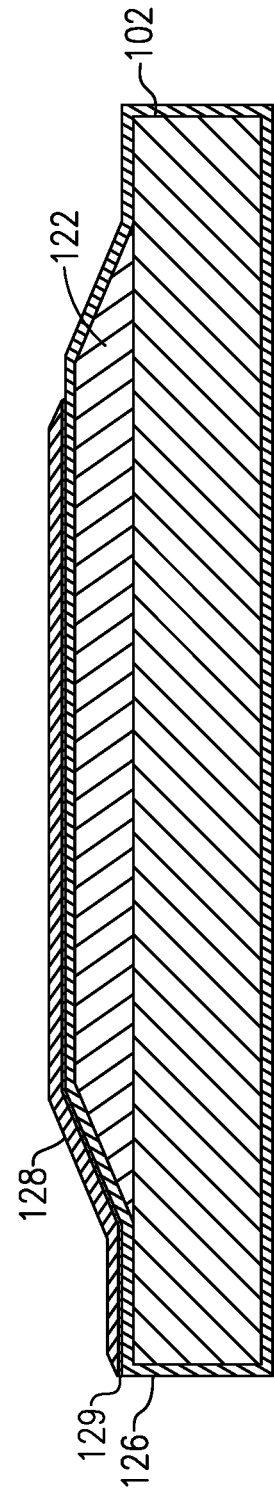

ACOUSTIC WAVE DEVICES WITH COMMON GLASS SUBSTRATE

CROSS REFERENCE TO PRIORITY APPLICATIONS

This application claims the benefit of priority of U.S. Provisional Patent Application No. 62/785,906, filed Dec. 28, 2018 and titled "BULK ACOUSTIC WAVE RESONATOR WITH SPINEL SUBSTRATE," and U.S. Provisional Patent Application No. 62/785,958, filed Dec. 28, 2018 and titled "ACOUSTIC WAVE RESONATORS WITH COMMON SPINEL SUBSTRATE," the disclosures of each of which are hereby incorporated by reference in their entireties herein.

BACKGROUND

Technical Field

Embodiments of this disclosure relate to acoustic wave devices, for example, bulk acoustic wave devices.

Description of Related Technology

Acoustic wave filters can be implemented in radio frequency electronic systems. For instance, filters in a radio frequency front end of a mobile phone can include one or more acoustic wave filters. A plurality of acoustic wave filters can be arranged as a multiplexer. For instance, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. Example BAW resonators include film bulk acoustic wave resonators (FBARs) and solidly mounted resonators (SMRs). In BAW filters, acoustic waves propagate in a bulk of a piezoelectric layer. A SAW filter can include an interdigital transducer electrode on a piezoelectric substrate and can generate a surface acoustic wave on a surface of the piezoelectric layer on which the interdigital transducer electrode is disposed.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

In one aspect, a bulk acoustic wave resonator is disclosed. The bulk acoustic wave resonator includes a ceramic substrate, a piezoelectric layer positioned on the ceramic substrate, and first and second electrodes positioned on opposing sides of the piezoelectric layer. The bulk acoustic wave resonator also includes passivation layers that includes a first passivation layer and a second passivation layer. The first passivation layer is positioned between the ceramic substrate and the first electrode. The second electrode is positioned between the piezoelectric layer and the second passivation layer. The bulk acoustic wave resonator further includes a frame structure along an edge of an active region of the bulk acoustic wave resonator.

In an embodiment, the ceramic substrate is a spinel substrate.

In an embodiment, the bulk acoustic wave resonator further includes an air cavity that is positioned between the ceramic substrate and the first electrode. The air cavity can be positioned over a surface of the ceramic substrate closest to the piezoelectric layer. The air cavity is formed to have an acute angle with respect to the surface of the ceramic substrate.

In an embodiment, the bulk acoustic wave resonator is a film bulk acoustic wave resonator.

In an embodiment, the bulk acoustic wave resonator further includes an acoustic mirror positioned between the ceramic substrate and the first electrode.

In an embodiment, the bulk acoustic wave resonator further includes an acoustic mirror positioned on two sides of the ceramic substrate beneath the frame structure.

In an embodiment, the frame structure includes at least one of ruthenium, molybdenum, tungsten, iridium, platinum, chromium, silicon dioxide, silicon nitride, silicon oxynitride, aluminum oxide, or silicon dioxide.

In an embodiment, the first passivation layer includes at least one of silicon dioxide, aluminum oxide, silicon carbide, aluminum nitride, silicon nitride, or silicon oxynitride.

In an embodiment, the ceramic substrate includes a planarized surface facing a center portion of the piezoelectric layer.

In an embodiment, the ceramic substrate is a polycrystalline ceramic substrate.

In an embodiment, at least a portion of the second electrode has a different thickness than the first electrode. The second electrode can include two different thicknesses.

In an embodiment, the frame structure includes a raised frame structure.

In an embodiment, the frame structure includes a raised frame structure and a recessed frame structure.

In an embodiment, the frame structure includes a first raised frame layer, and a second raised frame layer positioned between the first electrode and the piezoelectric layer.

In one aspect, an acoustic wave filter is disclosed. The acoustic wave filter includes a bulk acoustic wave resonator. The bulk acoustic wave resonator includes a piezoelectric layer positioned on a ceramic substrate, first and second electrodes positioned on opposing sides of the piezoelectric layer, a first passivation layer positioned between the ceramic substrate and the first electrode, a second passivation layer positioned such that the second electrode is positioned between the piezoelectric layer and the second passivation layer, a frame structure along an edge of an active region of the bulk acoustic wave resonator. The acoustic wave filter also include a plurality of acoustic wave resonators. The bulk acoustic wave resonator and the plurality of acoustic wave resonators together arranged to filter a radio frequency signal.

In an embodiment, the ceramic substrate is a spinel substrate.

In an embodiment, the radio frequency signal has a frequency in a range from 5 gigahertz to 10 gigahertz.

In one aspect a packaged module is disclosed. The packaged module includes a packaging substrate, and an acoustic wave filter positioned on the packaging substrate. The acoustic wave filter is configured to filter a radio frequency signal. The acoustic wave filter includes a bulk acoustic wave resonator. The bulk acoustic wave resonator includes a ceramic substrate and a frame structure outside of a middle area of an active region of the bulk acoustic wave resonator. The packaged module also includes a radio frequency component positioned on the packaging substrate. The acoustic wave filter and the radio frequency component are enclosed within a common package.

In an embodiment, the ceramic substrate is a spinel substrate.

In an embodiment, the radio frequency component includes a power amplifier.

In an embodiment, the radio frequency component includes a radio frequency switch.

In an embodiment, the packaged module further includes a surface acoustic wave resonator on the ceramic substrate.

In one aspect, an acoustic wave component is disclosed. The acoustic wave component includes a bulk acoustic wave resonator and a surface acoustic wave device. The bulk acoustic resonator includes a first portion of a ceramic substrate, a first piezoelectric layer positioned on the ceramic substrate, and electrodes positioned on opposing sides of the first piezoelectric layer. The surface acoustic wave device includes a second portion of the ceramic substrate, a second piezoelectric layer positioned on the ceramic substrate, and an interdigital transducer electrode positioned on the second piezoelectric layer.

In an embodiment, the ceramic substrate is a spinel substrate.

In an embodiment, the bulk acoustic wave resonator includes a frame structure along an edge of an active region of the bulk acoustic wave resonator.

In an embodiment, wherein the bulk acoustic wave resonator includes a passivation layer positioned between the ceramic substrate and an electrode of the electrodes that is closest to the ceramic substrate.

In an embodiment, the bulk acoustic wave resonator is a film bulk acoustic wave resonator.

In an embodiment, the bulk acoustic wave resonator includes an air cavity between the ceramic substrate and an electrode of the electrodes. The surface acoustic wave device can be disposed in the air cavity.

In an embodiment, the bulk acoustic wave resonator is positioned laterally from the surface acoustic wave device.

In an embodiment, the acoustic wave component further includes a receive filter and a transmit filter that are coupled to each other at a common node. The receive filter includes the surface acoustic wave device and the transmit filter includes the bulk acoustic wave resonator.

In an embodiment, the transmit filter further includes another surface acoustic wave device that includes a third portion of the ceramic substrate. The transmit filter can further include a loop circuit configured to generate an anti-phase signal to a target signal at a particular frequency. The loop circuit can include another surface acoustic wave device that includes a third portion of the ceramic substrate. The receive filter can further include a loop circuit configured to generate an anti-phase signal to a target signal at a particular frequency. The loop circuit can include another surface acoustic wave resonator that includes a third portion of the ceramic substrate.

In one aspect, a multiplexer is disclosed. The multiplexer includes a first filter that includes a bulk acoustic wave resonator and a second filter coupled to the first filter at a common node. The bulk acoustic wave resonator includes a first portion of a ceramic substrate, a first piezoelectric layer positioned on the ceramic substrate, and electrodes positioned on opposing sides of the first piezoelectric layer. The second filter includes a surface acoustic wave device. The surface acoustic wave device includes a second portion of the ceramic substrate, a second piezoelectric layer positioned on the ceramic substrate, and an interdigital transducer electrode positioned on the second piezoelectric layer.

In an embodiment, the ceramic substrate is a spinel substrate.

In one aspect, an acoustic wave component is disclosed. The acoustic wave component includes a film bulk acoustic wave resonator and another type of acoustic wave resonator. The film bulk wave resonator includes a first portion of a ceramic substrate, a piezoelectric layer positioned on the ceramic substrate, and electrodes positioned on opposing sides of the piezoelectric layer. The other type of acoustic wave resonator includes a second portion of the ceramic substrate.

In an embodiment, the ceramic substrate is a spinel substrate.

In an embodiment, the other type of acoustic wave resonator is a surface acoustic wave resonator.

In an embodiment, the other type of acoustic wave resonator is a solidly mounted resonator.

In an embodiment, the first portion of the ceramic substrate is laterally positioned from the second portion of the ceramic substrate.

In an embodiment, the first portion of the ceramic substrate substantially overlaps with the second portion of the ceramic substrate.

In one aspect, an acoustic wave component is disclosed. The acoustic wave component includes a bulk acoustic wave resonator that includes a first portion of a glass substrate, a first piezoelectric layer on the glass substrate, and electrodes on opposing sides of the first piezoelectric layer the acoustic wave component also includes a surface acoustic wave device that includes a second portion of the glass substrate, a second piezoelectric layer on the glass substrate, and an interdigital transducer electrode on the second piezoelectric layer.

In one embodiment, the glass substrate is a silicate glass substrate.

In one embodiment, the bulk acoustic wave resonator includes a frame structure along an edge of an active region of the bulk acoustic wave resonator.

In one embodiment, the bulk acoustic wave resonator includes a passivation layer between the glass substrate and an electrode of the electrodes that is closest to the glass substrate.

In one embodiment, the bulk acoustic wave resonator is a film bulk acoustic wave resonator.

In one embodiment, the bulk acoustic wave resonator includes an air cavity between the glass substrate and an electrode of the electrodes. The surface acoustic wave device can be disposed in the air cavity.

In one embodiment, the bulk acoustic wave resonator is positioned laterally from the surface acoustic wave device.

In one embodiment, the acoustic wave component further includes a receive filter and a transmit filter coupled to each other at a common node, the receive filter including the surface acoustic wave device and the transmit filter including the bulk acoustic wave resonator. The transmit filter can further include another surface acoustic wave device that includes a third portion of the glass substrate. The transmit filter can further include a loop circuit that is configured to generate an anti-phase signal to a target signal at a particular frequency. The loop circuit can include another surface acoustic wave device that includes a third portion of the glass substrate. The receive filter can further include a loop circuit that is configured to generate an anti-phase signal to a target signal at a particular frequency. The loop circuit can include another surface acoustic wave resonator that includes a third portion of the glass substrate.

In one aspect a multiplexer is disclosed. The multiplexer includes a first filter that includes a bulk acoustic wave resonator. The bulk acoustic wave resonator includes a first portion of a glass substrate, a first piezoelectric layer on the glass substrate, and electrodes on opposing sides of the first piezoelectric layer. The multiplexer also includes a second filter that is coupled to the first filter at a common node. The second filter includes a surface acoustic wave device. The surface acoustic wave device includes a second portion of the glass substrate, a second piezoelectric layer on the glass substrate, and an interdigital transducer electrode on the second piezoelectric layer.

In one embodiment, the glass substrate is a silicate glass substrate.

In one aspect, an acoustic wave component is disclosed. The acoustic wave component includes a film bulk acoustic wave resonator that includes a first portion of a glass substrate, a piezoelectric layer on the glass substrate, and electrodes on opposing sides of the piezoelectric layer. The acoustic wave component also includes another type of acoustic wave resonator including a second portion of the glass substrate.

In one embodiment, the glass substrate is a silicate glass substrate.

In one embodiment, the other type of acoustic wave resonator is a surface acoustic wave resonator.

In one embodiment, the other type of acoustic wave resonator is a solidly mounted resonator.

In one embodiment, the first portion of the glass substrate is laterally positioned from the second portion of the glass substrate.

In one embodiment, the first portion of the glass substrate substantially overlaps with the second portion of the glass substrate.

In one aspect, a bulk acoustic wave resonator is disclosed. The bulk acoustic wave resonator includes a spinel substrate, a piezoelectric layer on the spinel substrate, first and second electrodes on opposing sides of the piezoelectric layer, passivation layers including a first passivation layer and a second passivation layer, and a frame structure along an edge of an active region of the bulk acoustic wave resonator. The first passivation layer is positioned between the spinel substrate and the first electrode. The second electrode is positioned between the piezoelectric layer and the second passivation layer.

In an embodiment, the bulk acoustic wave resonator further includes an air cavity that is positioned between the spinel substrate and the first electrode. The air cavity can be positioned over a surface of the spinel layer closest to the piezoelectric layer. The air cavity can be formed to have an acute angle with respect to the surface of the spinel substrate.

In an embodiment, the bulk acoustic wave resonator is a film bulk acoustic wave resonator.

In an embodiment, the bulk acoustic wave resonator further includes an acoustic mirror that is positioned between the spinel substrate and the first electrode.

In an embodiment, the bulk acoustic wave resonator further includes an acoustic mirror that is positioned on two sides of the spinel substrate beneath the frame structure.

In an embodiment, the frame structure includes at least one of ruthenium, molybdenum, or silicon dioxide.

In an embodiment, the first passivation layer includes silicon dioxide.

In an embodiment, the spinel substrate includes a planarized surface facing a center portion of the piezoelectric layer.

In an embodiment, the spinel substrate is a polycrystalline spinel substrate.

In an embodiment, at least a portion of the second electrode has a different thickness than the first electrode. The second electrode can include two different thicknesses.

In an embodiment, an acoustic wave filter is disclosed. The acoustic wave filter can include acoustic wave resonators that are arranged to filter a radio frequency signal. The acoustic wave resonators can include a bulk acoustic wave resonator of any of the above embodiments. A front end module that includes the acoustic wave filter, additional circuitry, and a package enclosing the surface acoustic wave filter and the additional circuitry is disclosed. The additional circuitry can include a multi-throw radio frequency switch. The additional circuitry can include a power amplifier. A wireless communication device that includes the antenna and the acoustic wave filter is disclosed. The acoustic wave filter can be arranged to filter a radio frequency signal associated with the antenna.

In one aspect, a method of manufacturing a bulk acoustic wave resonator is disclosed. The method includes depositing a sacrificial layer over a spinel substrate, and forming a first electrode of a bulk acoustic wave resonator over the sacrificial layer. The method also includes forming a piezoelectric layer and a second electrode of the bulk acoustic wave resonator over the first electrode such that the piezoelectric layer is positioned between the first electrode and the second electrode. The method further includes removing sacrificial material of the sacrificial layer between the first electrode and piezoelectric layer and the spinel substrate to form an air gap.

In an embodiment, the bulk acoustic wave resonator further includes smoothing a surface of the spinel substrate prior to the depositing.

In an embodiment, the bulk acoustic wave resonator further includes performing chemical mechanical polishing on a surface of the spinel substrate prior to the depositing In an embodiment, the forming the first electrode is performed such that the first electrode is in physical contact with a passivation layer.

In an embodiment, the bulk acoustic wave resonator further includes depositing a passivation layer over the second electrode.

In an embodiment, the bulk acoustic wave resonator is a film bulk acoustic wave resonator.

In an embodiment, the sacrificial layer is deposited directly over the spinel substrate.

The method can further include forming a frame structure of the bulk acoustic wave resonator.

In one aspect, a packaged module is disclosed. The packaged module includes a packaging substrate and an acoustic wave filter positioned on the packaging substrate. The acoustic wave filter is configured to filter a radio frequency signal. The acoustic wave filter includes a bulk acoustic wave resonator. The bulk acoustic wave resonator includes a spinel substrate and a frame structure outside of a middle area of an active region of the bulk acoustic wave resonator. The packaged module also includes a radio frequency component positioned on the packaging substrate. The acoustic wave filter and the radio frequency component are enclosed within a common package.

In an embodiment the radio frequency component includes a power amplifier.

In an embodiment, the radio frequency component includes a radio frequency switch.

In an embodiment, the packaged module further includes a surface acoustic wave resonator on the spinel substrate.

In an embodiment, the bulk acoustic wave resonator further includes any suitable one or more of the above features.

In one aspect, a bulk acoustic wave resonator is disclosed. The bulk acoustic wave resonator can include a spinel substrate, a piezoelectric layer on the spinel substrate, first and second electrodes on opposing sides of the piezoelectric layer, and passivation layers that include a first passivation layer and a second passivation layer. The first passivation layer is positioned between the spinel substrate and the first electrode. The second electrode is positioned between the piezoelectric layer and the second passivation layer. The bulk acoustic wave resonator also includes a frame structure along an edge of an active region of the bulk acoustic wave resonator.

In an embodiment, the bulk acoustic wave resonator further includes an air cavity positioned between the spinel substrate and the first electrode. The air cavity can be over a surface of the spinel layer closest to the piezoelectric layer.

In an embodiment, the air cavity is formed to have an acute angle with respect to the surface of the spinel substrate.

In an embodiment, the bulk acoustic wave resonator is a film bulk acoustic wave resonator.

In an embodiment, the bulk acoustic wave resonator further includes an acoustic mirror positioned between the spinel substrate and the first electrode.

In an embodiment, the bulk acoustic wave resonator further includes an acoustic mirror positioned on two sides of the spinel substrate beneath the frame structure.

In an embodiment, the frame structure includes at least one of ruthenium, molybdenum, or silicon dioxide.

In an embodiment, the first passivation layer includes silicon dioxide.

In an embodiment, the spinel substrate includes a planarized surface facing a center portion of the piezoelectric layer.

In an embodiment, the spinel substrate is a polycrystalline spinel substrate.

In an embodiment, at least a portion of the second electrode has a different thickness than the first electrode.

In an embodiment, the second electrode includes two different thicknesses.

In an embodiment, an acoustic wave filter that includes acoustic wave resonators arranged to filter a radio frequency signal is disclosed. The acoustic wave resonators can include a bulk acoustic wave resonator of any of the above embodiments. A front end module can include the acoustic wave filter, additional circuitry, and a package enclosing the surface acoustic wave filter and the additional circuitry. The additional circuitry can include a multi-throw radio frequency switch. The additional circuitry can include a power amplifier. In an embodiment, a wireless communication device that includes the antenna and then acoustic wave filter is disclosed. The acoustic wave filter can be arranged to filter a radio frequency signal associated with the antenna.

In one aspect, a method of manufacturing a bulk acoustic wave resonator is disclosed. The method includes depositing a sacrificial layer over a spinel substrate, forming a first electrode of a bulk acoustic wave resonator positioned over the sacrificial layer, forming a piezoelectric layer and a second electrode of the bulk acoustic wave resonator positioned over the first electrode such that the piezoelectric layer is positioned between the first electrode and the second electrode, and removing sacrificial material of the sacrificial layer positioned between the first electrode and piezoelectric layer and the spinel substrate to form an air gap.

In an embodiment, the method further includes smoothing a surface of the spinel substrate prior to the depositing.

In an embodiment, the method further includes performing chemical mechanical polishing on a surface of the spinel substrate prior to the depositing In an embodiment, the forming the first electrode is performed such that the first electrode is in physical contact with a passivation layer.

In an embodiment, the method further includes depositing a passivation layer over the second electrode.

In an embodiment, the bulk acoustic wave resonator is a film bulk acoustic wave resonator.

In an embodiment, the sacrificial layer is deposited directly over the spinel substrate.

In an embodiment, the method further includes forming a frame structure of the bulk acoustic wave resonator.

In one aspect, an acoustic wave component is disclosed. The acoustic wave component includes a bulk acoustic wave resonator and a surface acoustic wave resonator. The bulk acoustic wave resonator includes a first portion of a spinel substrate, a first piezoelectric layer positioned on the spinel substrate, and electrodes positioned on opposing sides of the first piezoelectric layer. The surface acoustic wave resonator includes a second portion of the spinel substrate, a second piezoelectric layer positioned on the spinel substrate, and an interdigital transducer electrode positioned on the second piezoelectric layer.

In an embodiment, the bulk acoustic wave resonator includes a frame structure along an edge of an active region of the bulk acoustic wave resonator.

In an embodiment, the bulk acoustic wave resonator includes a passivation layer between the spinel substrate and an electrode of the electrodes that is closest to the spinel substrate.

In an embodiment, the bulk acoustic wave resonator is a film bulk acoustic wave resonator.

In an embodiment, the bulk acoustic wave resonator includes an air cavity between the spinel substrate and an electrode of the electrodes, the air cavity being over a surface of the spinel layer closest to the electrode.

In an embodiment, the acoustic wave component further includes a receive filter and a transmit filter that are coupled to each other at a common node. The receive filter can include the surface acoustic wave resonator and the transmit filter including the bulk acoustic wave resonator.

In an embodiment, the transmit filter further includes another surface acoustic wave resonator that includes a third portion of the spinel substrate.

In an embodiment, the transmit filter further includes a loop circuit. The loop circuit can include another surface acoustic wave resonator that includes a third portion of the spinel substrate.

In an embodiment, the receive filter further includes a loop circuit. The loop circuit can include another surface acoustic wave resonator that includes a third portion of the spinel substrate.

In an embodiment, the bulk acoustic wave resonator further includes any suitable one or more of the above features.

In one aspect, an acoustic wave component is disclosed. The acoustic wave component includes a film bulk acoustic wave resonator and another type pf acoustic wave resonator. The film bulk acoustic wave component includes a first portion of a spinel substrate, a piezoelectric layer positioned on the spinel substrate, and electrodes positioned on opposing sides of the piezoelectric layer. The other type of acoustic wave resonator includes a second portion of the spinel substrate.

In an embodiment, the other type of acoustic wave resonator is a surface acoustic wave resonator.

In an embodiment, the other type of acoustic wave resonator is a solidly mounted resonator.

In an embodiment, the acoustic wave component further includes any suitable one or more if the above features.

In one aspect, a multiplexer is disclosed. The multiplexer includes a receive filter that is coupled to a common node and a transmit filter that is coupled to the common node. The receive filter includes a surface acoustic wave resonator. The surface acoustic wave resonator includes a first portion of a spinel substrate. The transmit filter transmit filter includes a bulk acoustic wave resonator. The bulk acoustic wave resonator includes a second portion of the spinel substrate.

In an embodiment, the multiplexer is a duplexer.

In an embodiment, the bulk acoustic wave resonator further includes one or more suitable features of the above embodiments.

In an embodiment, the multiplexer further includes one or more suitable features of the above embodiments.

In one aspect, a method of manufacturing an acoustic wave component is disclosed. The method includes forming a bulk acoustic wave resonator on a spinel substrate, forming a different type of acoustic wave resonator on the spinel substrate.

In an embodiment, the different type of resonator is a surface acoustic wave resonator.

In an embodiment, the method further comprising electrically connecting the bulk acoustic wave resonator and the different type of resonator such that they are included in a band pass filter. The filter is a transmit filter, and the different type of acoustic wave resonator is coupled between the bulk acoustic wave resonator and an output port of the transmit filter.

In one aspect, a packaged module is disclosed. The packaged module includes a packaging substrate, an acoustic wave filter positioned on the packaging substrate. The acoustic wave filter is configured to filter a radio frequency signal. The acoustic wave filter includes a bulk acoustic wave resonator. The bulk acoustic wave resonator includes a spinel substrate and a frame structure outside of a middle area of an active region of the bulk acoustic wave resonator. The packaged module also includes a radio frequency component positioned on the packaging substrate. The acoustic wave filter and the radio frequency component are enclosed within a common package.

In an embodiment, the radio frequency component includes a power amplifier.

In an embodiment, the radio frequency component includes a radio frequency switch.

In an embodiment, the packaged module further includes a surface acoustic wave resonator on the spinel substrate.

In an embodiment, the bulk acoustic wave resonator further includes one or more suitable features of above embodiments.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 16/726,072, titled "BULK ACOUSTIC WAVE RESONATOR WITH CERAMIC SUBSTRATE," filed on even date herewith, the entire disclosure of which is hereby incorporated by reference herein. The present disclosure relates to U.S. patent application Ser. No. 16/726,107, titled "ACOUSTIC WAVE DEVICES WITH COMMON CERAMIC SUBSTRATE," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

FIGS. 1A to 1E are a cross sectional views illustrating a process of manufacturing a bulk acoustic wave resonator according to an embodiment.

FIG. 1A illustrates a cross section of a device including a spinel substrate and a sacrificial layer.

FIG. 1B illustrates a cross section of a device including a spinel substrate and an island pattern for the sacrificial layer.

FIG. 1C illustrates a cross section of a device including a first electrode over the island pattern.

FIG. 1D illustrates a cross section with a piezoelectric layer and a second electrode over the first electrode.

FIG. 1E is a cross sectional view of a bulk acoustic wave device on a spinel substrate according to an embodiment.

DETAILED DESCRIPTION OF CERTAIN EMBODIMENTS

Figure 1D:
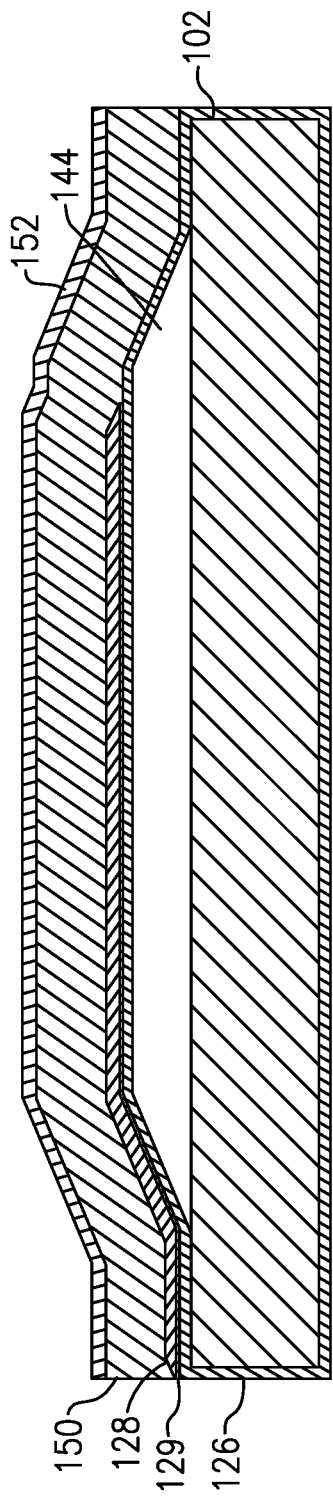

The following description of certain embodiments presents various descriptions of specific embodiments. However, the innovations described herein can be embodied in a multitude of different ways, for example, as defined and covered by the claims. In this description, reference is made to the drawings, where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Various bulk acoustic wave (BAW) resonators are formed on silicon wafers. When a silicon wafer is used as a substrate of BAW resonator for radio frequency (RF) filter fabrication, high-resistivity silicon (HRS) can be used to implement a relatively high performance resonator. The HRS substrate can blocking energy leakage into the substrate. In forming a BAW structure that is made on the wafer and an air cavity that allows free vibration of the BAW resonator, the substrate can be protected by using a silicon dioxide ($SiO_2$) film for protecting the substrate in the operation of removing sacrificial layer and the like. In order to form a silicon dioxide film, a deposition method such as chemical vapor deposition (CVD) and/or physical vapor deposition (PVD) to oxidize the silicon substrate can be used. During such a process, electrons and holes can be charged up at the interface between the oxide and the substrate. These mobile electrons and holes can cause the resistance of an HRS substrate to be reduced. This can adversely affect the characteristics of a BAW resonator, such as the quality factor (Q) value and/or the BAW filter characteristic.

A BAW resonator can be fabricated directly on the silicon interface to avoid the mobile electrons and/or holes generated at the interface between oxide and silicon. In this case, unique processes and chemicals can be used to realize BAW structure. Alternatively or additionally, a trap layer can be formed between oxide and silicon to reduce and/or eliminate mobility.

Aspects of this disclosure relate to a BAW resonator on a spinel substrate. The spinel substrate can be a polycrystalline spinel substrate. The polycrystalline spinel substrate can be a magnesium aluminate ($MgAl_2O_4$) spinel substrate. Such a BAW resonator can have good RF performance and mechanical processing characteristics. Gas that removes the sacrificial layer may not etch the spinel substrate at all. Accordingly, a sacrificial layer can be formed directly over the spinel substrate. As such, a BAW resonator on a spinel substrate can provide desirable RF characteristics and also to simplify a manufacturing process.

There are a number of advantages associated with BAW resonators on a spinel substrate. For example, there can be a relatively low tangent loss at radio frequencies. A BAW resonator on a spinel substrate can provide better mechanical strength than a similar BAW resonator on an HRS substrate. A BAW resonator on a spinel substrate can have good processability during processing, such as dicing. BAW resonators on spinel substrates can reduce and/or eliminate mobilized electrons and holes that can be present in other BAW resonators. BAW resonators on spinel substrates can reduce and/or eliminate resistivity reduction of the substrate by thermal donors of oxygen impurity. Moreover, a BAW resonator and a different type of acoustic wave resonator can be implemented on a common spinel substrate.

A spinel substrate is an example of a ceramic substrate. Any suitable principles and advantages of embodiments that include a spinel substrate can be implemented by any suitable ceramic substrate. For example, an acoustic wave device and/or acoustic wave component and/or acoustic wave filter can be implemented with a ceramic substrate in accordance with any suitable principles and advantages disclosed herein. Moreover, any suitable principles and advantages of embodiments that include a spinel substrate can be implemented by a glass substrate. For example, an acoustic wave device and/or acoustic wave component and/or acoustic wave filter can be implemented with a glass substrate in accordance with any suitable principles and advantages disclosed herein.

The acoustic wave resonators disclosed herein can be implemented in acoustic wave filters. The acoustic wave filters can be band pass filters arranged to pass a radio frequency band and attenuate frequencies outside of the radio frequency band. Two or more acoustic wave filters can be coupled together at a common node and arranged as a multiplexer, such as a duplexer.

Acoustic wave filters can filter radio frequency (RF) signals in a variety of applications, such as in an RF front end of a mobile phone. An acoustic wave filter can be implemented with surface acoustic wave (SAW) devices and/or BAW resonators. SAW devices include SAW resonators, SAW delay lines, and multi-mode SAW (MMS) filters (e.g., double mode SAW (DMS) filters).

FIGS. 1A to 1E are example cross-sectional views illustrating a process of manufacturing a bulk acoustic wave resonator on a spinel substrate according to an embodiment. The BAW resonator can be included in a band pass filter, for example.

FIG. 1A is a cross sectional view of a spinel substrate 102 with a sacrificial layer 104 on the spinel substrate 102. The spinel substrate 102 can be a polycrystalline spinel substrate (e.g., a magnesium aluminate ($MgAl_2O_4$) polycrystalline spinel substrate). The spinel substrate 102 can have relatively high resistivity. In an illustrative example, the spinel substrate 102 may be formed by combining two different materials. For example, spinel may be formed by combining alumina and magnesia together. In some embodiments, the spinel material may be formed from a high-purity powder. The powder may then be formed, sintered, and machined. For example, one or more surfaces of the spinel substrate 102, such as a top and bottom surfaces, may be smoothed and/or planarized using chemical mechanical polishing (CMP). With such smoothing and/or planarization, the spinel substrate 102 can have a surface roughness of less than 1 nanometer (nm). As an example, the spinel substrate may be formed to have a 0.4 nm surface roughness (Ra). As another example, mechanical polishing may be used to achieve a surface roughness of less than 3 nm, such as a roughness of 2 nm or less. For instance, the spinel substrate 102 can be a polycrystalline spinel substrate with a surface roughness in a range from about 0.1 nm to 2 nm in certain applications. A surface that has been planarized using mechanical polishing procedures may be referred to as a planarized surface once the surface is adequately polished according to a predetermined specification (e.g., surface roughness, uniformity across the substrate, sufficiently uniform thickness of the substrate across the length of the substrate, etc.).

The spinel substrate 102 may be formed to have certain material properties within a predetermined range. For example, the spinel substrate 102 may have a density within a range of 3.4 to 3.7 grams per centimeters cubed, such that the density approximates 3.6 grams per centimeter. As another example, the spinel substrate 102 can have a coefficient of thermal expansion of roughly 5.9 ppm/K and a thermal conductivity of roughly 18.0 W/mK.

The sacrificial layer 104 can be deposited directly on the spinel substrate 102 as illustrated. The sacrificial layer 104 can be removed at a later stage of manufacture. By removing the sacrificial layer 104, an air cavity can for formed, for example, as will be described below in connection with FIG. 1E. The sacrificial layer 104 can be formed of any suitable sacrificial material, such as amorphous silicon or polysilicon. The sacrificial layer 104 may be formed in direct contact with at least a portion of spinel substrate 102. The sacrificial layer 104 may be substantially parallel with the spinel substrate 102 with respect to at least one surface of each.

The structure shown in FIG. 1A becomes part of a BAW resonator, and more specifically a film bulk acoustic wave resonator (FBAR), as disclosed in connection with FIGS. 1B to 1E. Other types of acoustic wave resonators, such as SAW resonators, boundary acoustic wave resonators, SMRs, and/or Lamb wave resonators, can also be formed on the spinel substrate 102. In certain embodiments, the spinel substrate may be of a substantially uniform thickness. In some other embodiments, the spinel substrate may be of various thicknesses. For example, in an embodiment where the spinel substrate is used as a common substrate for multiple acoustic wave filters, various thicknesses may correspond to the footprint for different acoustic wave filters that are formed on the spinel substrate.

In some embodiments (not illustrated in FIGS. 1A to 1E), an upper portion of the spinel substrate 102 may be etched away. For example, the spinel substrate 102 may be etched in one or more portions near the center of the footprint of the filter to form a cavity. In such embodiments, a sacrificial layer may be deposited within the one or more cavities of spinel substrate 102. In addition, a sacrificial layer 104 may be formed above and within the one or more cavities of spinel substrate 102. In some examples, the sacrificial layer 104 may be formed of different materials, such that the layers may be removed at different stages. For example, a sacrificial layer of one material may be formed in the one or more cavities of spinel substrate 102, whereas another sacrificial layer 104 of another material may be formed above the planar surface of spinel substrate 102 and the underlying sacrificial layer. In some embodiments, the sacrificial layer 104 may not be used. In an example, a bulk acoustic wave resonator may be a solidly mounted resonator (SMR) with an acoustic mirror. Certain SMRs can be formed without the sacrificial layer 104. In some other embodiments, an acoustic mirror may be used in conjunction with a sacrificial layer 104, such that an air cavity may be formed above or below the acoustic mirror in a BAW-SMR device.

FIG. 1B is a cross sectional view that illustrates that sacrificial material can be patterned over the spinel substrate 102 to form a patterned sacrificial layer 122. As shown in FIG. 1B, the sacrificial layer 122 has been etched into an island pattern. The island pattern may have angled edges as shown or may have sharper edges. For example, the formation of the slopes for the island pattern on one or both sides may be controlled to make less than a 90 degree angle with respect to the top surface of the spinel substrate 102, for example, as shown. The island pattern of the patterned sacrificial layer 122 may be covered by a passivation layer 126 as illustrated.

FIG. 1C is a cross sectional view illustrating an electrode 128 disposed over the spinel substrate 102 and the patterned sacrificial layer 122. The electrode 128 may be of any suitable conductive material. As illustrated, the first electrode 128 extends across a portion of the patterned sacrificial layer 122. The first electrode 128 may have one or more angled edges. For example, the slope of one or more edges of the electrode may be formed to approximate the slope formed by the patterned sacrificial layer 122 with respect to the planar surface of the spinel substrate 102. A layer 129 may be disposed between electrode 128 and an upper surface of spinel substrate 102 and the patterned sacrificial layer 122. Layer 129 may be formed to extend along all or at least a portion of electrode 128. In some embodiments, layer 129 may extend beyond electrode 128, such that there is only some overlap with the electrode 128.

FIG. 1D is a cross sectional view illustrating a piezoelectric layer 150 and a second electrode 152 over the first electrode 128. The piezoelectric layer 150 is disposed between the first electrode 128 and the second electrode 152. The piezoelectric layer 150 can be an aluminum nitride (AlN) layer or any other suitable piezoelectric layer. An active region or active domain of a bulk acoustic wave resonator can be defined by the portion of the piezoelectric layer 150 that overlaps with both the first electrode 128 and the second electrode 152 over an air cavity 144. In the embodiment shown in FIG. 1D, the first and second electrodes 128 and 152, respectively, overlap for a significant portion of the piezoelectric layer 150.

Figure 1E:
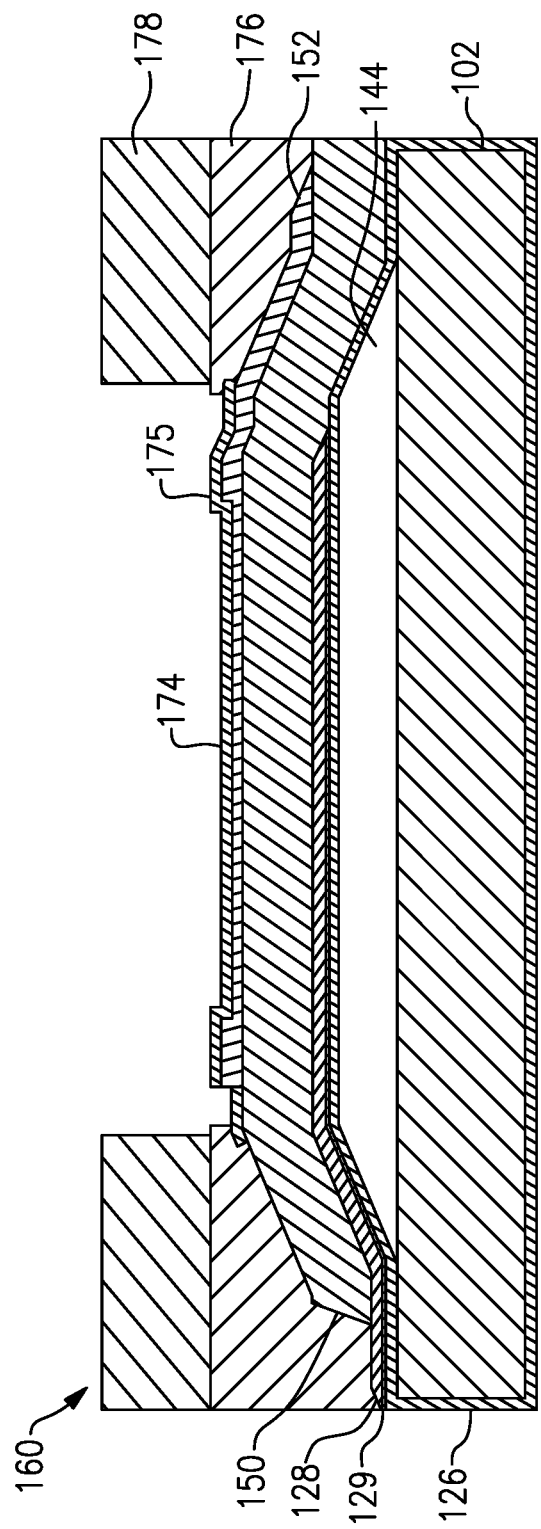

FIG. 1E is a cross sectional view of a bulk acoustic wave resonator 160. As illustrated, the bulk acoustic wave resonator 160 includes the piezoelectric layer 150, the first electrode 128, the second electrode 152, a frame structure (e.g., raised frame structure 175), a spinel substrate 102, an air cavity 144, and electrical connection layers that include a first layer 176 and a second layer 178. A layer 129 may be included below the first electrode 128, for example, as described above. The first layer 176 can include one or more of ruthenium, molybdenum, or silicon dioxide. The second layer 178 can include titanium and/or copper. The patterned sacrificial layer 122 from FIGS. 1B to 1D can be removed to form the air cavity 144 shown in FIG. 1E.

The bulk acoustic wave resonator 160 of FIG. 1E is an FBAR. The air cavity 144 is included between the first electrode 128 and the spinel substrate 102. In addition, one or more passivation layers can be included between the first electrode 128 and the spinel substrate 102. For example, the passivation layer 126 is positioned between the first electrode 128 and the spinel substrate in FIG. 1E. The passivation layer can include at least one of silicon dioxide, aluminum oxide, silicon carbide, aluminum nitride, silicon nitride, or silicon oxynitride. The illustrated air cavity 144 is defined at least in part by the geometry of the first electrode 128 and the spinel substrate 102. The air cavity 144 may be formed by removing the patterned sacrificial layer 122 deposited on the spinel substrate 102.

Figure 1F:
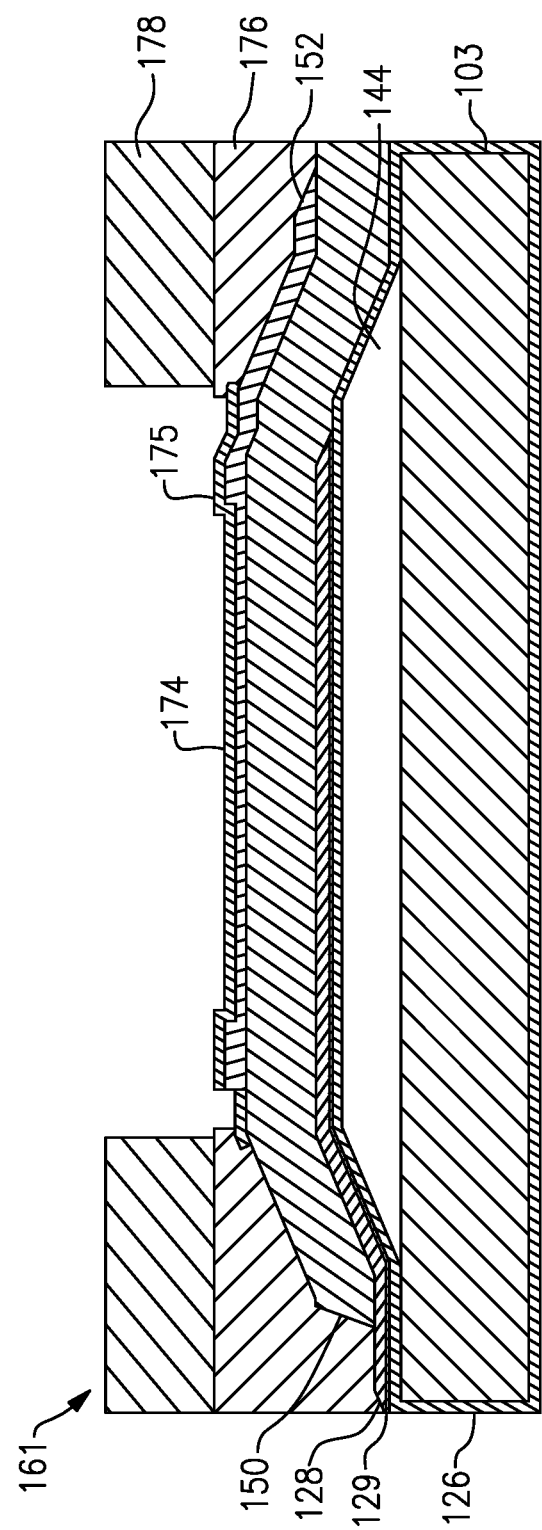
FIG. 1F is a cross sectional view of a bulk acoustic wave resonator device on a ceramic substrate according to an embodiment.
Figure 1G:
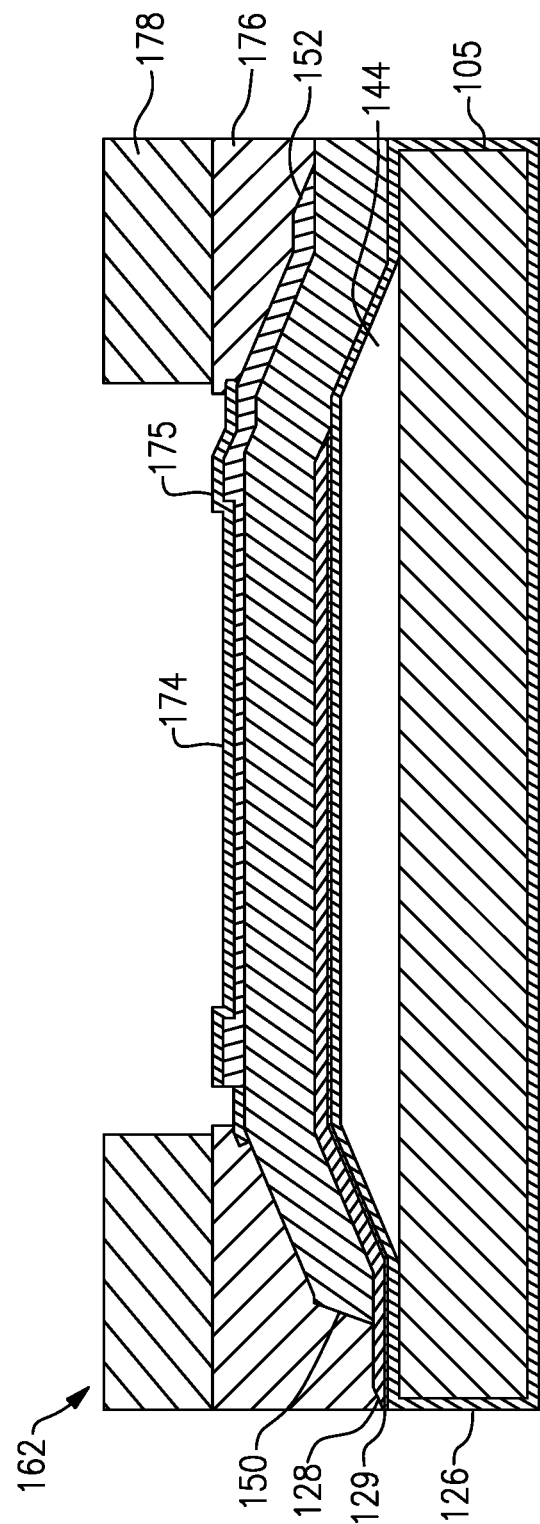
FIG. 1G is a cross sectional view of a bulk acoustic wave resonator device on a glass substrate according to an embodiment.
Figure 1H:
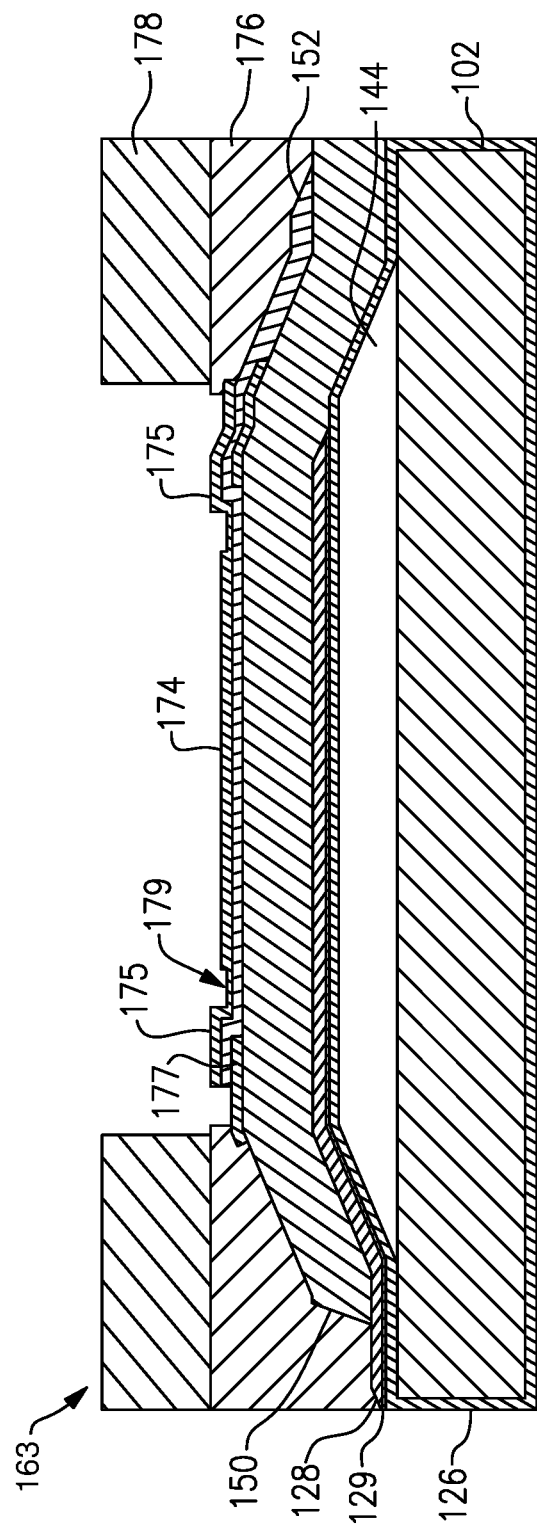
FIG. 1H is a cross sectional view of a bulk acoustic wave resonator device on a spinel substrate according to another embodiment.
Figure 1I:
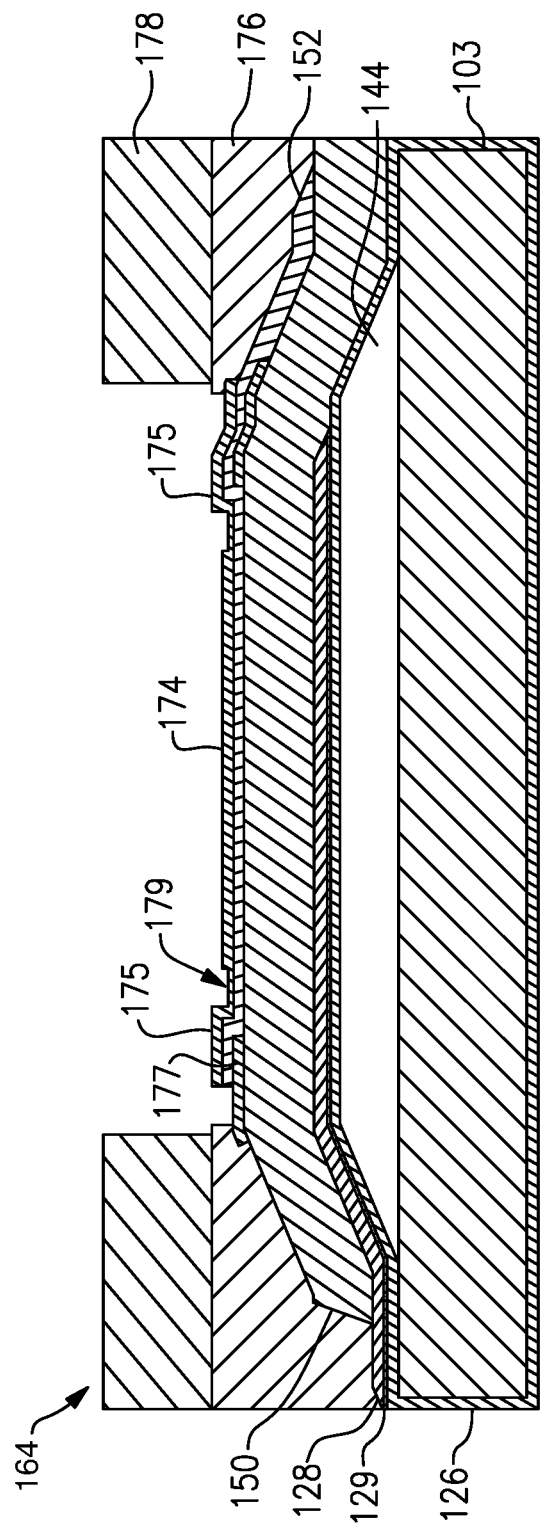
FIG. 1I is a cross sectional view of a bulk acoustic wave resonator device on a ceramic substrate according to another embodiment.
Figure 1J:
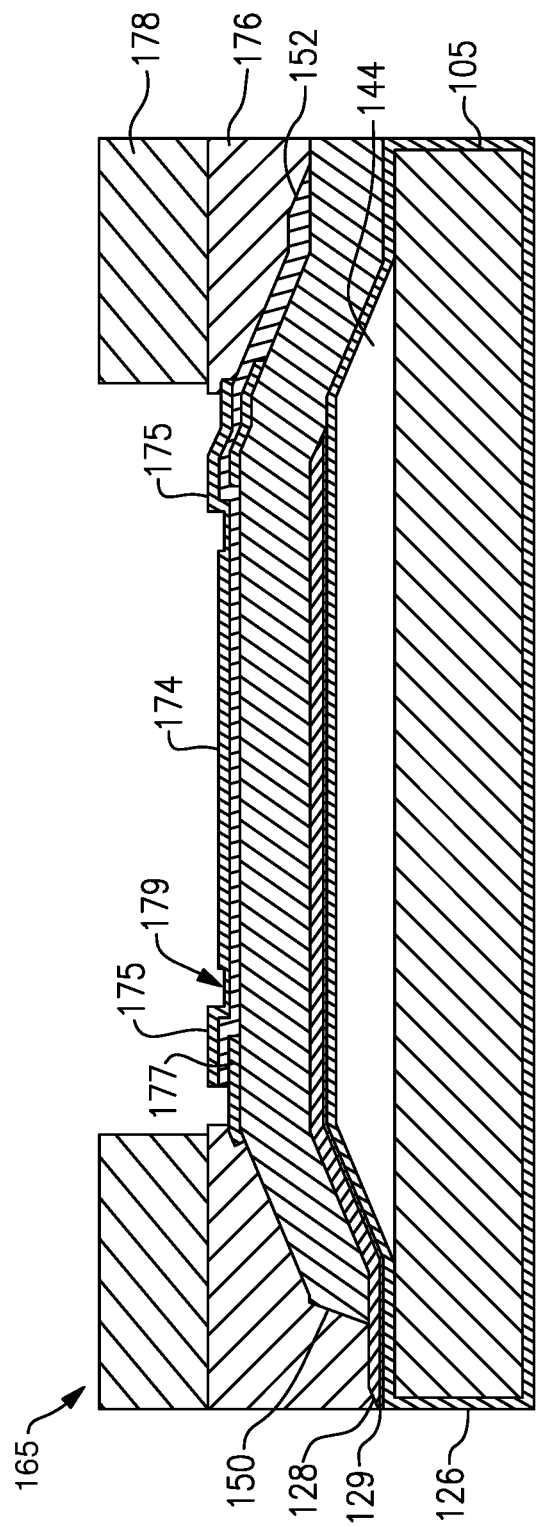
FIG. 1J is a cross sectional view of a bulk acoustic wave resonator device on a glass substrate according to another embodiment.

Bulk acoustic wave resonators can include a frame structure. The frame structure can include a raised frame structure, a recessed frame structure, or a raised frame structure and a recessed frame structure. An example frame structure that includes a raised frame structure is shown in FIGS. 1E-1G. An example frame structure that includes a raised frame structure and a recessed frame structure is illustrated in FIGS. 1H-1J.

The bulk acoustic wave resonator 160 includes an active region where the first and second electrodes 128 and 152 overlap in a direction substantially normal to an upper surface of the spinel substrate 102. The bulk acoustic wave resonator 160 of FIG. 1E includes a raised frame zone around a perimeter of the active region of the bulk acoustic wave resonator 160. The raised frame zone can be referred to as a border ring in certain instances. The raised frame structure 175 is in the raised frame zone. The raised frame structure 175 is outside of a middle area of the active region of the bulk acoustic wave device. The raised frame structure 175 is in the raised frame zone and extends above the first and second electrodes 128 and 152, respectively, and piezoelectric layer 150. The raised frame structure 175 can include at least one of ruthenium, molybdenum tungsten, iridium, platinum, chromium, silicon dioxide, silicon nitride, silicon oxynitride, aluminum oxide, or silicon carbide The raised frame structure 175 can be a relatively high density material. For instance, the second raised frame layer 24 can include molybdenum (Mo), tungsten (W), ruthenium (Ru), the like, or any suitable alloy thereof. The raised frame structure 175 can be a metal layer. Alternatively, the raised frame structure 175 can be a suitable non-metal material with a relatively high density. The density of the raised frame structure 175 can be similar or heavier than the density of the second electrode 152. The raised frame structure 175 can have a relatively high acoustic impedance. The raised frame structure 175 can reduce a transverse spurious mode. The raised frame structure 175 can block lateral energy leakage from the active domain of the bulk acoustic wave resonator 160. This can increase the quality factor (Q) of the bulk acoustic wave resonator 160. The raised frame structure 175 can be annular in plan view. In some embodiments, a bulk acoustic wave resonator 160 may include two raised frame domains.

One or more passivation layers 174 can be included over the second electrode 152. For instance, a silicon dioxide passivation layer can be included as the passivation layer 174 over the second electrode 152. The passivation layer 174 can be formed with different thicknesses in different regions of the bulk acoustic wave resonator 160. In addition, the first electrode 128 and/or the second electrode 152 may be formed to have different thicknesses in different regions of the bulk acoustic wave resonator 160. For example, as shown in FIG. 1E, the second electrode 152 is thinner in various portions of the bulk acoustic wave resonator 160. In certain embodiments, the second electrode 152 of the bulk acoustic wave resonator 160 may include different material than the first electrode 128 of the bulk acoustic wave resonator 160. The second electrode 152 has different thicknesses in different regions.

The bulk acoustic wave resonator 160 can have a relatively high resonant frequency. A combination of material of the piezoelectric layer 150 and thickness of piezoelectric layer 150 can impact resonant frequency. With a thinner piezoelectric layer 150, the resonant frequency can be higher. Aluminum nitride can be a suitable material for achieving a relatively high resonant frequency.

Bulk acoustic wave resonators disclosed herein can have a piezoelectric layer 150 with a material and thickness combination that can achieve a resonant frequency of up to about 13 GHz with desirable electrical characteristics (e.g., desirable Q values). Such BAW resonators can have a ceramic substrate, a magnesium aluminate spinel substrate, or a glass substrate. BAW resonators disclosed herein can filter radio frequency signals in an operating band in a range from 3.5 GHz to 13 GHz. For example, a piezoelectric layer 150 of aluminum nitride can have a thickness of about 0.4 µm for filtering frequency signals in an operating band of about 5 GHz. For example, a piezoelectric layer 150 of aluminum nitride can have a thickness of about 0.2 µm for filtering frequency signals in an operating band of about 10 GHz. For example, the piezoelectric layer 150 can have a thickness of about 0.1 µm for filtering frequency signals in an operating band in a range of 12 GHz to 13 GHz.

Although FIGS. 1A to 1E illustrate cross sectional views of manufacturing an FBAR, any suitable principles and advantages disclosed herein can be applied to other suitable acoustic wave resonators, such as a solidly mounted resonator (SMR) or a Lamb wave resonator.

As discussed above, the bulk acoustic wave resonator 160 includes a spinel base substrate 102. The spinel substrate 102 can improve the quality factor (Q) relative to using a different substrate.

A spinel substrate is an example of a ceramic substrate. FIG. 1F is a cross sectional view of a bulk acoustic wave resonator 161. The bulk acoustic wave resonator 161 is generally similar to the bulk acoustic wave resonator 160 illustrated in FIG. 1E, except that the bulk acoustic wave resonator 161 includes a ceramic substrate 103 in place of the spinel substrate 102 of the bulk acoustic wave resonator 160. The ceramic substrate 103 can include, for example, polycrystalline spinel (e.g., $MgAl_2O_4$ which can be referred to as a magnesium aluminate spinel), co-fired ceramic, sapphire ($Al_2O_3$), silicon carbide (SiC), or polycrystalline aluminum nitride (AlN). The ceramic substrate 130 can have higher acoustic impedance than an acoustic impedance of the piezoelectric layer 150. Some ceramic materials, such as $Al_2O_3$ and SiC, can have better thermal conductivity, power handling, and ruggedness than other materials. A manufacturing process similar to that illustrated in FIGS. 1A-1E can be applied to manufacturing the bulk wave resonator 161 illustrated in FIG. 1F. Moreover, any suitable principles and advantages of devices, components, and filters disclosed herein that include a spinel substrate can be applied to devices, components, and filters that includes a ceramic substrate.

FIG. 1G is a cross sectional view of a bulk acoustic wave resonator 162. The bulk acoustic wave resonator 162 is generally similar to the bulk acoustic wave resonators 160, 161 illustrated in FIGS. 1E and 1F, except that the bulk acoustic wave resonator 162 includes a glass substrate 105 in place of the spinel substrate 102 of the bulk acoustic wave resonator 160 and in place of the ceramic substrate 103 of the bulk acoustic wave resonator 161. The glass substrate 105 includes a non-crystalline amorphous solid. The glass substrate 105 can include a silicate glass, such as fused quartz glass, lead glass, borosilicate glass, soda-lime silicate glass, aluminosilicate glass, or germanium-oxide glass. A manufacturing process similar to that illustrated in FIGS. 1A-1E can be applied to manufacturing the bulk wave resonator 162 illustrated in FIG. 1G. As with the spinel layer substrate 102, the glass substrate 105 can improve the quality factor (Q) relative to using a different substrate. Moreover, any suitable principles and advantages of devices, components, and filters disclosed herein that include a spinel substrate can be applied to devices, components, and filters that include a glass substrate.

FIG. 1H is a cross sectional view of a bulk acoustic wave resonator 163. The bulk acoustic wave resonator 163 is generally similar to the bulk acoustic wave resonator 160 illustrated in FIG. 1E, except that the bulk acoustic wave resonator 163 has a frame structure that includes a raised frame structure 175, a second raised frame structure 177 and a recessed frame structure 179. With the raised frame structures 175 and 177, the bulk acoustic wave resonator 163 can be referred to as a dual raised frame bulk acoustic wave resonator or a multi-layer raised frame bulk acoustic wave resonator.

The raised frame structure 175 and the second raised frame structure 177 overlap with each other in the active region of the bulk acoustic wave resonator 163. A raised frame domain of the bulk acoustic wave device 163 is defined by the portion of dual raised frame structure in the active domain of the bulk acoustic wave device 163. At least a portion of the dual raised frame structure is included in an active region of the bulk acoustic wave device 163. The dual raised frame structure can improve Q significantly due to highly efficient reflection of lateral energy.

As illustrated in FIG. 1H, the second raised frame structure 177 is positioned between the piezoelectric layer 150 and the second electrode 152. The second raised frame structure 177 is a low acoustic impedance material. The low acoustic impedance material has a lower acoustic impedance than the first electrode 128. The low acoustic impedance material has a lower acoustic impedance than the second electrode 152. The low acoustic impedance material can have a lower acoustic impedance than the piezoelectric layer 150. As an example, the second raised frame structure 177 can be a silicon dioxide ($SiO_2$) layer. Because silicon dioxide is already used in a variety of bulk acoustic wave devices, a silicon dioxide second raised frame structure 177 can be relatively easy to manufacture. The second raised frame structure 177 can be a silicon nitride (SiN) layer, a silicon carbide (SiC) layer, or any other suitable low acoustic impedance layer. The second raised frame structure 177 can have a relatively low density. The second raised frame structure 177 can extend beyond the active region of the bulk acoustic wave resonator 163. This can be for manufacturability reasons in certain instances.

The second raised frame structure 177 can reduce an effective electromechanical coupling coefficient ($k^2$) of the raised frame domain of the bulk acoustic wave resonator 163 relative to a similar device without the second raised frame structure 177. This can reduce excitation strength of a raised frame spurious mode. Moreover, the second raised frame structure 177 can contribute to move the frequency of the raised frame mode relatively far away from the main resonant frequency of the bulk acoustic wave resonator 163, which can result in no significant effect on a Gamma loss.

A spinel substrate is an example of a ceramic substrate. FIG. 1I is a cross sectional view of a bulk acoustic wave resonator 164. The bulk acoustic wave resonator 164 is generally similar to the bulk acoustic wave resonator 163 illustrated in FIG. 1H, except that the bulk acoustic wave resonator 164 includes a ceramic substrate 103 in place of the spinel substrate 102 of the bulk acoustic wave resonator 163. The ceramic substrate 103 can include, for example, polycrystalline spinel (e.g., $MgAl_2O_4$), co-fired ceramic, or polycrystalline aluminum nitride (AlN). The ceramic substrate 130 can have higher acoustic impedance than an acoustic impedance of the piezoelectric layer 150. Any suitable principles and advantages of devices, components, and filters disclosed herein that include a spinel substrate can be applied to devices, components, and filters that includes a ceramic substrate.

FIG. 1J is a cross sectional view of a bulk acoustic wave resonator 165. The bulk acoustic wave resonator 165 is generally similar to the bulk acoustic wave resonators 163 and 164 illustrated in FIGS. 1H and 1I, respectively, except that the bulk acoustic wave resonator 165 includes a glass substrate 105 in place of the spinel substrate 102 of the bulk acoustic wave resonator 163 and in place of the ceramic substrate 103 of the bulk acoustic wave resonator 164. The glass substrate 105 includes a non-crystalline amorphous solid. The glass substrate 105 can include a silicate glass, such as fused quartz glass, lead glass, borosilicate glass, soda-lime silicate glass, aluminosilicate glass, or germanium-oxide glass. Any suitable principles and advantages of devices, components, and filters disclosed herein that include a spinel substrate and/or a ceramic substrate can be applied to devices, components, and filters that include a glass substrate.

Embodiments disclosed herein may include the spinel substrate 102. However, the spinel substrate 102 of any of the embodiments disclosed herein can be replaced with another suitable substrate, such as the ceramic substrate 103 or the glass substrate 105.

Figure 2:
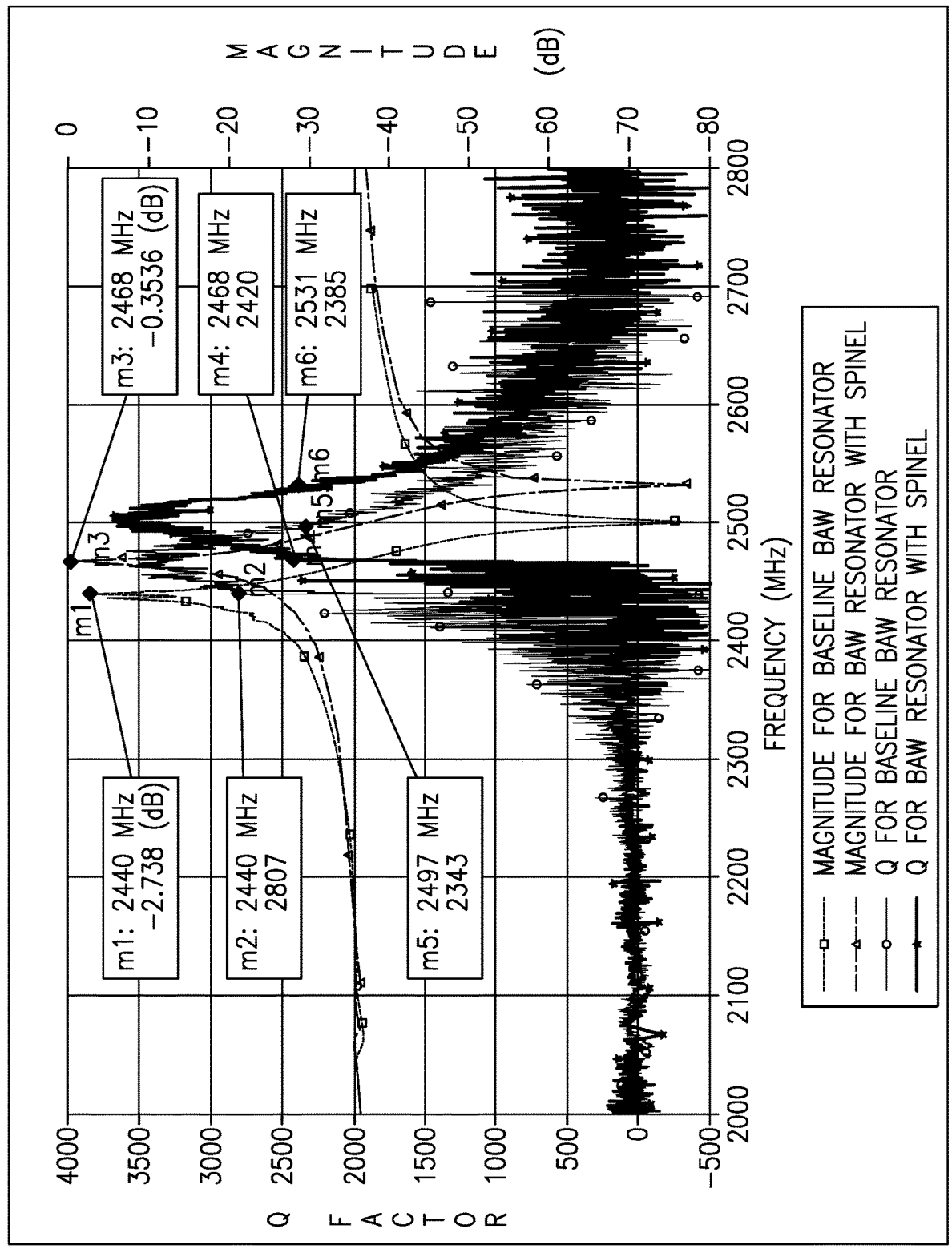
FIG. 2 is a graph that compares quality factor and magnitude for an acoustic wave resonator having a spinel substrate according to an embodiment with a baseline bulk acoustic wave resonator.

FIG. 2 is a graph of quality factor (Q) and magnitude for a BAW resonator having a spinel substrate according to an embodiment relative to a BAW resonator with a silicon substrate with a trap rich layer in place a spinel substrate. As illustrated by the Q curves in FIG. 2, BAW resonators having a spinel substrate can achieve an improved Q relative to other BAW resonators. FIG. 2 also shows that BAW resonators having a spinel substrate can achieve an improved admittance relative to other BAW resonators.

Figure 3:
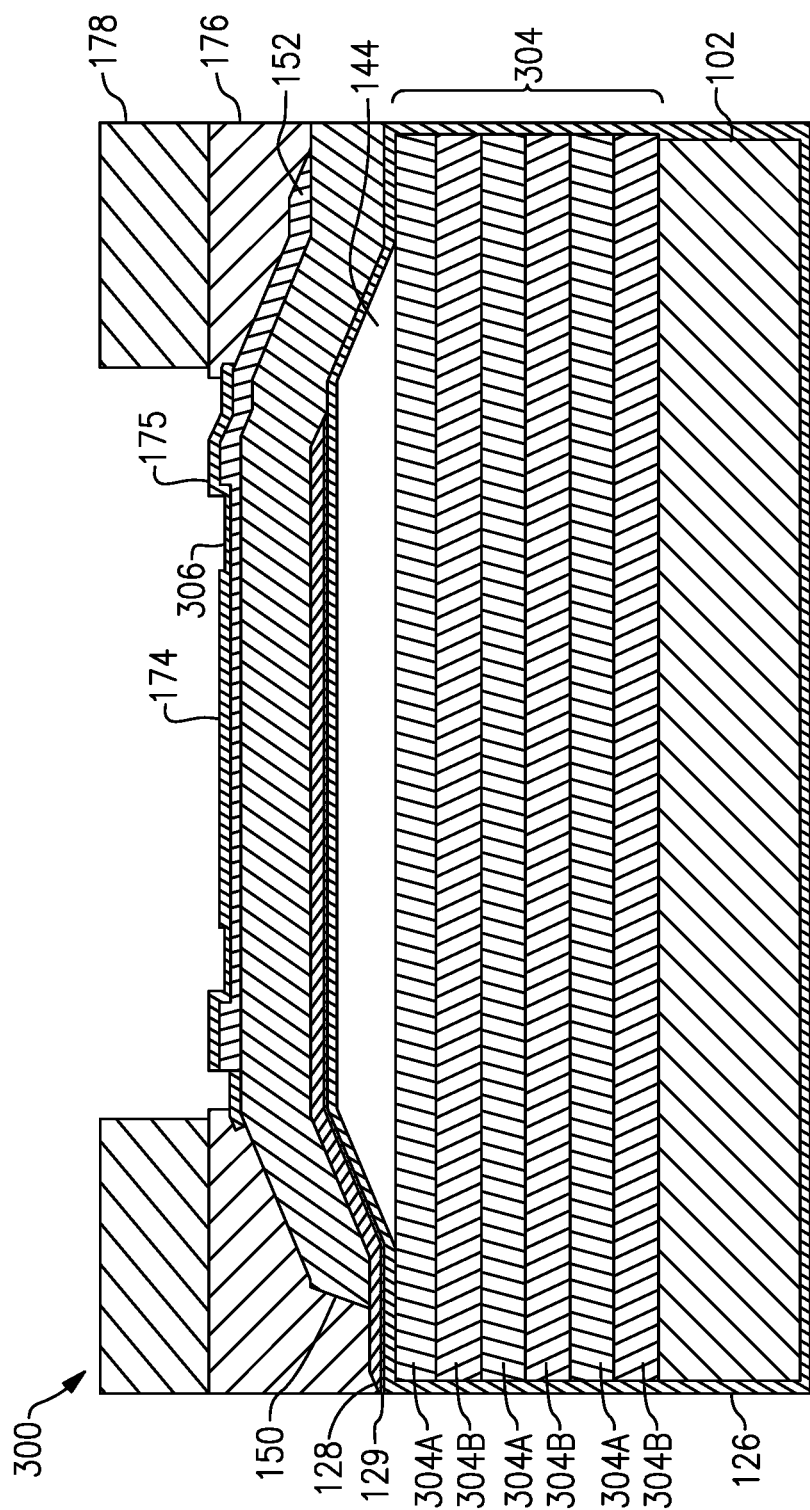
FIG. 3 is a cross sectional view of a bulk acoustic wave resonator according to another embodiment.

FIG. 3 is a cross sectional view of a bulk acoustic wave resonator 300 according to an embodiment. The bulk acoustic wave resonator 300 is like the bulk acoustic wave resonator 160 of FIG. 1E, except that an acoustic mirror 304 is included between the spinel substrate 102 and the first electrode 128 and the bulk acoustic wave resonator 300 includes a recessed frame structure 306. In some other embodiments (not illustrated), the air gap or air cavity can be omitted from the bulk acoustic wave resonator 300. The illustrated acoustic mirror 304 includes a Bragg reflector with alternating low impedance and high impedance layers 304A and 304B. As an example, the Bragg reflector can include alternating silicon dioxide layers 304A and tungsten layers 304B. An acoustic mirror with a Bragg reflector can be referred to as a solid acoustic mirror. Any other suitable features of an SMR can alternatively or additionally be implemented in a BAW resonators with a spinel substrate.

Figure 4:
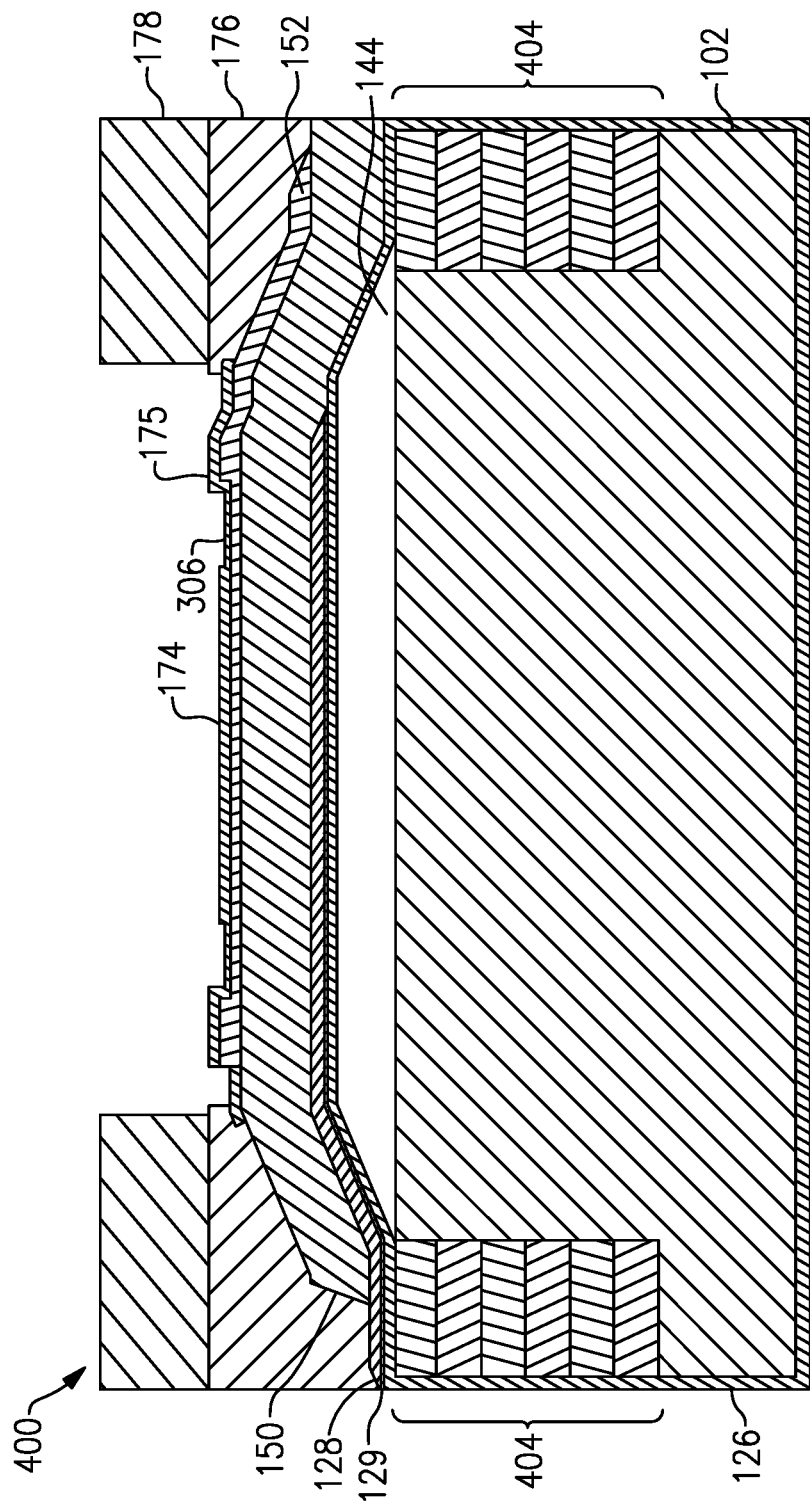
FIG. 4 is a cross sectional view of a bulk acoustic wave resonator according to another embodiment.

FIG. 4 is a cross sectional view of a bulk acoustic wave resonator 400 according to an embodiment. The bulk acoustic wave resonator 400 is like the bulk acoustic wave resonator 300 of FIG. 3, except that the acoustic mirrors are positioned differently. In FIG. 4, the BAW resonator 400 includes an acoustic mirror 404 disposed below the raised framed structure. The illustrated acoustic mirror 404 includes a Bragg reflectors. As illustrated, the Bragg reflectors are shown on opposing sides of the bulk acoustic wave resonator 400. In the bulk acoustic wave resonator 400, the Bragg reflectors are positioned outside the active domain. The spinel substrate 102 is included below the first electrode 128 in the active domain of the bulk acoustic wave resonator 400. The Bragg reflectors include alternating low impedance and high impedance layers, such as alternating silicon dioxide layers and tungsten layers. Any other suitable features of an SMR can alternatively or additionally be implemented in a BAW device.

Figure 5A:
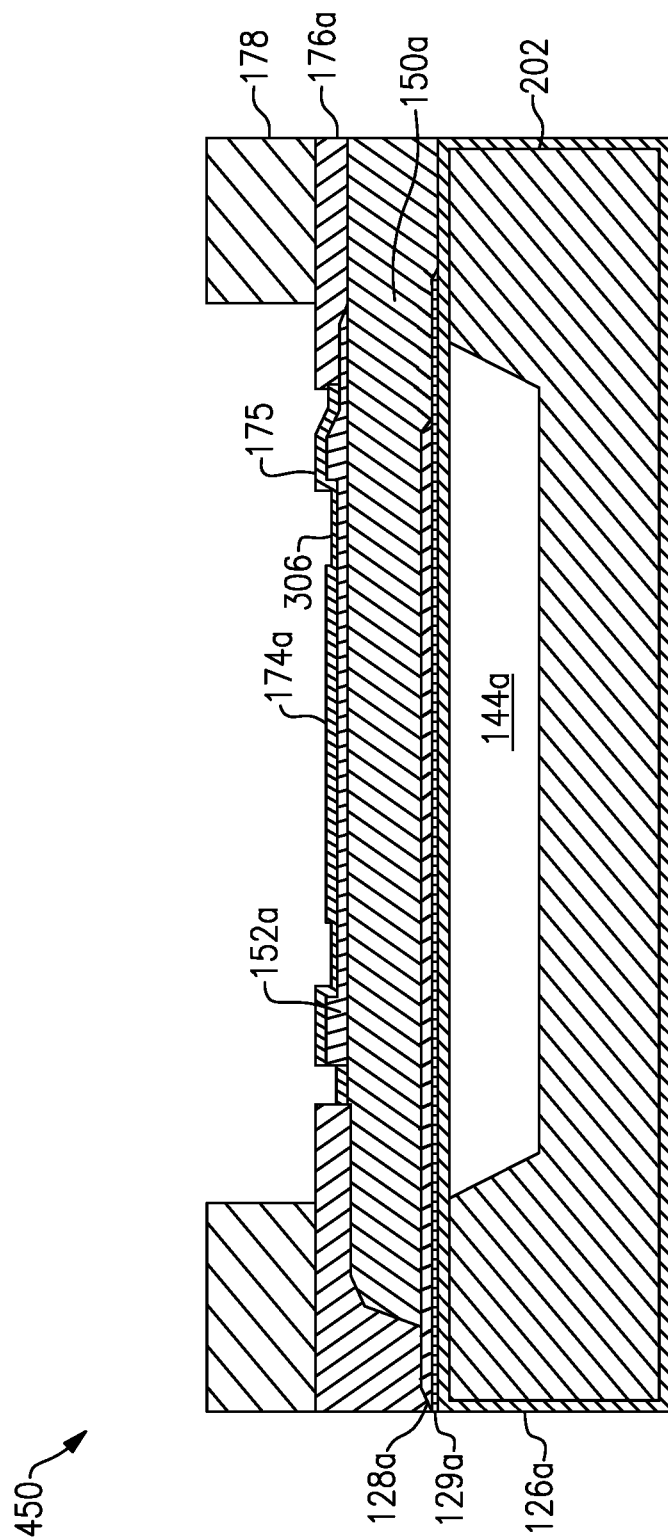
FIG. 5A is a cross sectional view of a bulk acoustic wave resonator according to another embodiment.

FIG. 5A is a cross sectional view of a bulk acoustic wave resonator 450 according to another embodiment. The bulk acoustic wave resonator 450 is like the bulk acoustic wave resonator 160 of FIG. 1E, except that an air cavity 144a is formed in a spinel substrate 202 and the bulk acoustic wave resonator 450 includes a recessed frame structure 306. The air cavity 144a can be etched into the spinel substrate 202. Layers (e.g., a first electrode 128a, a second electrode 152a, a piezoelectric layer 150a, a first layer 176a, a layer 129a, a passivation layer 126a, and a passivation layer 174a) over the spinel substrate 202 are differently shaped in FIG. 5A as compared to the layers (e.g., the first electrode 128, the second electrode 152, the piezoelectric layer 150, the first layer 176, the layer 129, the passivation layer 126 and the passivation layer 174) in FIG. 1E. The layers in FIG. 5A can have generally similar properties, characteristics, and/or functionalities as the layers in FIG. 1E.

Figure 5B:
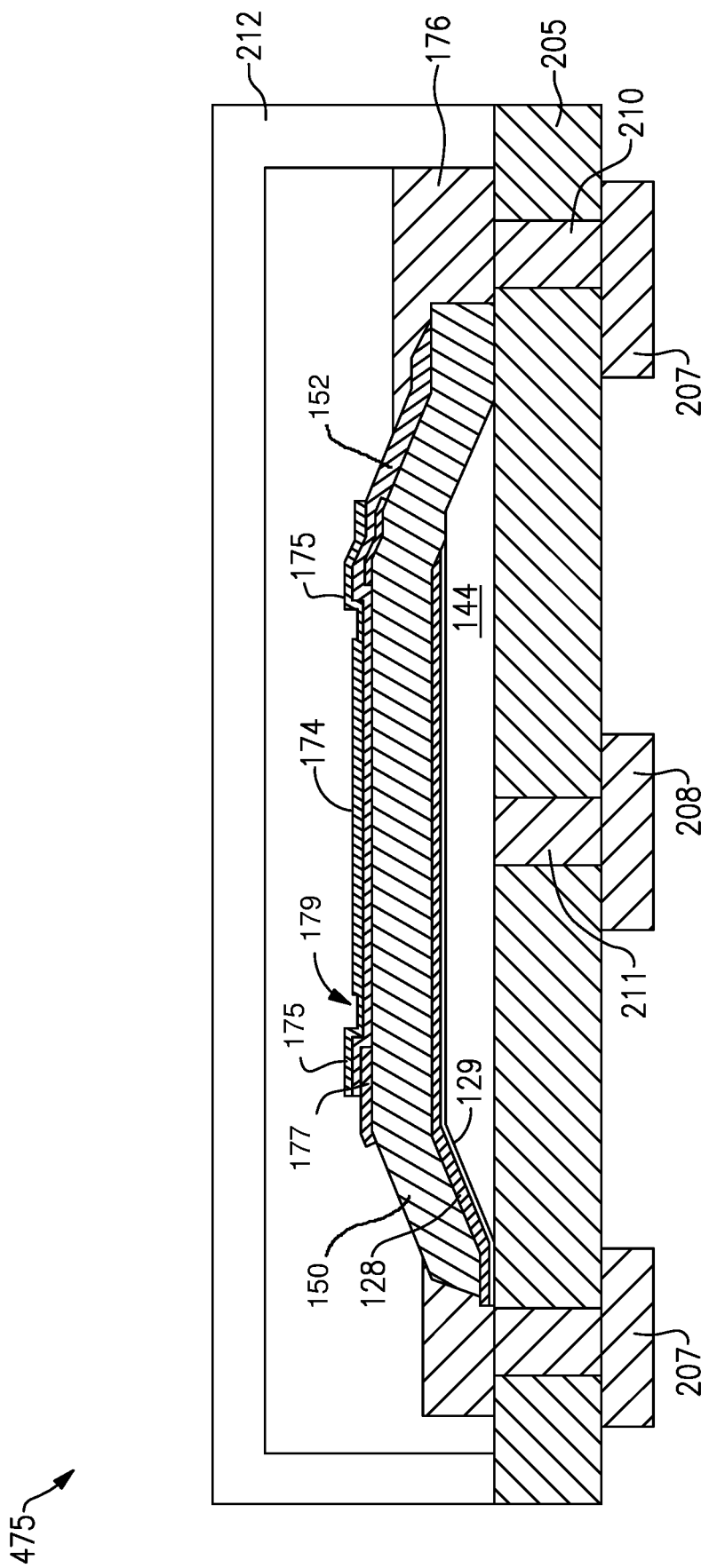
FIG. 5B is a cross sectional view of a bulk acoustic wave resonator according to another embodiment.

FIG. 5B is a cross sectional view of a bulk acoustic wave resonator 475 according to another embodiment. As illustrated, the bulk acoustic wave resonator 475 includes a piezoelectric layer 150, a first electrode 128, a second electrode 152, a frame structure (e.g., raised frame structures 175 and 177 and a recessed frame structure 179), a substrate 205, an air cavity 144, and electrical connection layers that include a first layer 176. A layer 129 may be included below the first electrode 128. The first layer 176 can include one or more of ruthenium, molybdenum, or silicon dioxide. The bulk acoustic wave resonator 475 also includes vias (e.g., a signal via 210 and a thermal via 211), and pads (e.g., a signal pad 207 and a thermal pad 208) that connect to corresponding vias. The bulk acoustic wave resonator 475 further includes a lid 212 over the substrate 205. In some embodiments, the substrate 205 can be a ceramic substrate (e.g., a spinel substrate) or a glass substrate.

The signal pad 207 and/or the thermal pad 208 can connect the 475 to an external device or substrate (e.g., a printed circuit board (PCB)). The thermal via 211 and the thermal pad 208 can provide the bulk acoustic wave resonator 475 a better thermal conductivity than a similar bulk acoustic wave resonator without the thermal via and/or the thermal pad.

In some instances, the principles and advantages of thermal dissipation in the bulk acoustic wave resonator 475 can be applied to a solid mounted resonator (SMR). In such instances a thermal via can extend through a solid acoustic mirror.

Various types of acoustic wave resonators and/or devices can be implemented on a common substrate (e.g., a spinel substrate, a ceramic substrate, or a glass substrate). Accordingly, an acoustic wave component can include different types of acoustic wave resonators and/or devices on a common spinel substrate and within a common package. For example, an FBAR and a SAW resonator can be implemented on a common spinel substrate. In some instances, an FBAR and a temperature compensated SAW resonator can be implemented on a common spinel substrate. As another example, an FBAR and an SMR can be implemented on a common spinel substrate. As another example, a BAW resonator and a Lamb wave resonator can be implemented on a common spinel substrate. As one more example, a BAW resonator and a boundary wave resonator can be implemented on a common spinel substrate. Any suitable combination of features of the embodiments disclosed herein with different types of acoustic wave resonators on a common spinel substrate can be implemented with each other. Also, any suitable combination of features of the embodiments disclosed herein with different types of acoustic wave resonators on a common ceramic substrate and/or a common glass substrate can be implemented with each other.

Figure 6A:
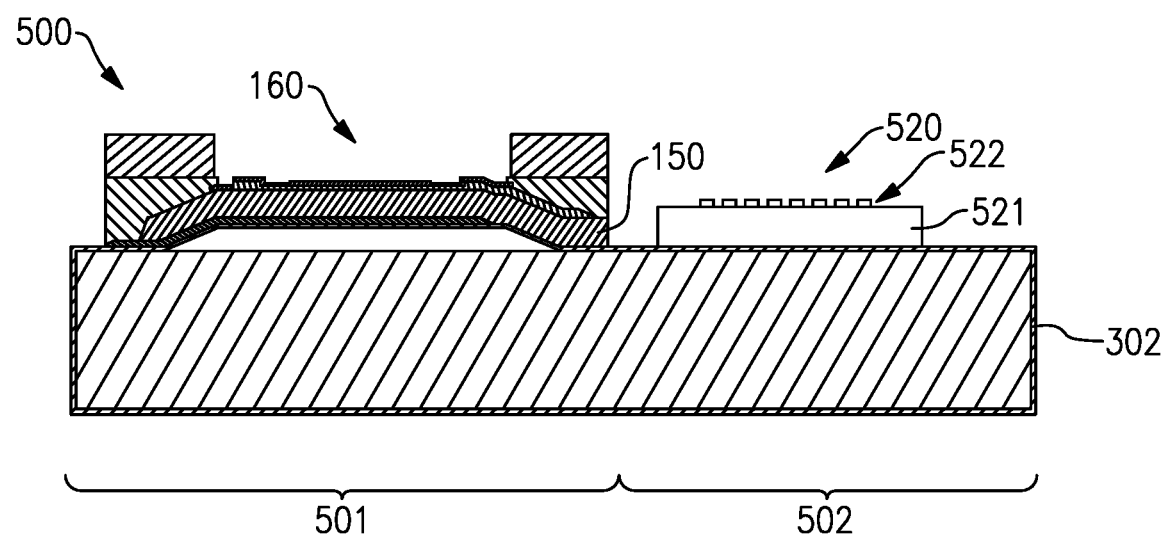
FIG. 6A is a cross sectional view of a bulk acoustic wave resonator and a surface acoustic wave device on a common spinel substrate according to an embodiment.

FIG. 6A shows an example cross section 500 of a BAW resonator 160 and a SAW device 520 on a common substrate 302. BAW resonators in accordance with any suitable principles and advantages disclosed herein can be implemented on the same substrate as a SAW device and/or resonator. The SAW device 520 can be a SAW resonator. Any suitable combination of the BAW and SAW resonators can be formed on a common substrate 203. For example, as illustrated, the BAW resonator 160, which is illustrated as an FBAR, may be positioned laterally from the SAW device 520 on the common substrate 302. The SAW device 520 includes a piezoelectric layer 521 on the common substrate 302 and an interdigital transducer electrode 522 on the piezoelectric layer 521. The common substrate 302 can be a ceramic substrate (e.g., a spinel substrate) or a glass substrate. The piezoelectric layer 521 can be a lithium tantalate (LT) layer or a lithium niobate (LN) layer, for example. In some instances, the piezoelectric layer 521 of the SAW device 520 can be the same material as the piezoelectric layer 150 of the BAW resonator 160. For example, the piezoelectric layer 521 of the SAW device 520 can be an aluminum nitride layer and the piezoelectric layer 150 of the BAW resonator 160 can be an aluminum nitride layer.

In the acoustic wave component of FIG. 6A, a first portion 501 of the substrate 302 can be considered part of the BAW resonator 160 and a second portion 502 of the common substrate 302 can be considered part of the SAW device 520. The common substrate 302 can be part of a multilayer piezoelectric substrate of the SAW device 520. A dispersion adjustment layer can be included between the piezoelectric layer 521 of the SAW device 520 and the common substrate 302 in certain applications. Although not illustrated in FIG. 6A, the SAW device 520 can be a temperature compensated SAW device with a temperature compensation layer over the interdigital transducer electrode. The temperature compensation layer can be a silicon dioxide layer, for example.

Figure 6B:
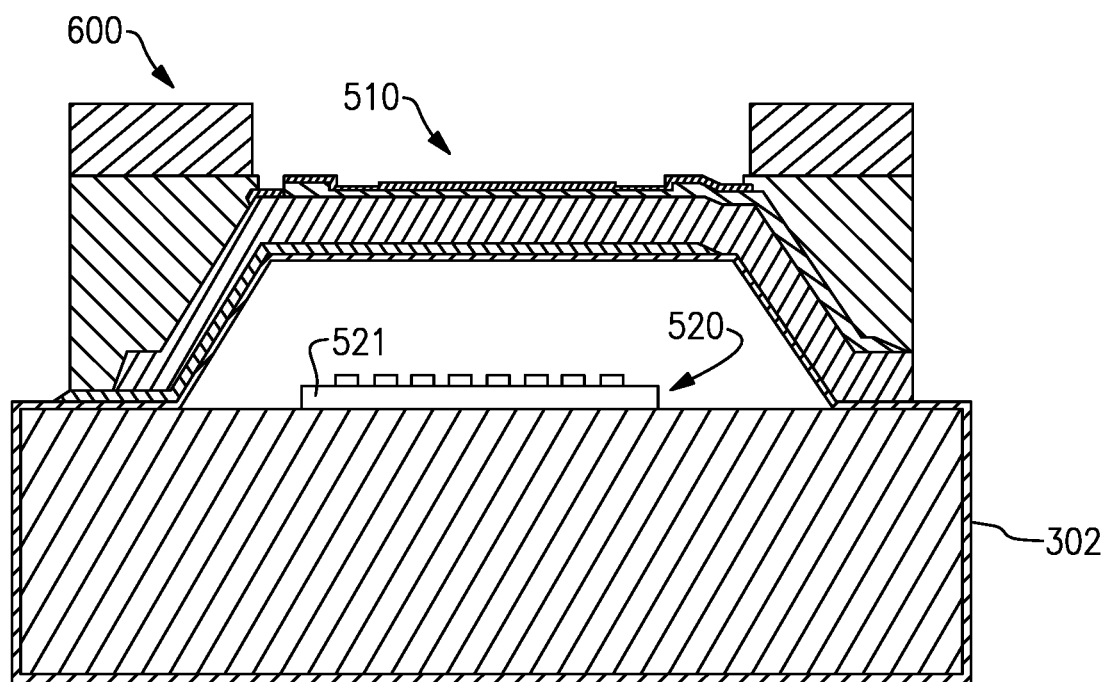
FIG. 6B is a cross sectional view of a bulk acoustic wave resonator and surface acoustic wave device on a common spinel substrate according to another embodiment.

FIG. 6B shows an example embodiment of an acoustic wave component 600 including a SAW device 520 formed in the air cavity of a BAW resonator 510. The air cavity 144 of the BAW resonator 510 can have a size sufficient to accommodate the SAW device 520. Accordingly, the BAW resonator 510 can have a taller air cavity than the BAW resonator 160 in certain applications. The electrodes and piezoelectric layer of the BAW resonator 510 can serve as a cap for the SAW device 520. The piezoelectric layer 521 of the SAW device 520 may be in direct contact with the common substrate 302. Alternatively, an intervening layer can be included between the piezoelectric layer 521 of the SAW device 520 and the common substrate 302.

Figure 7A:
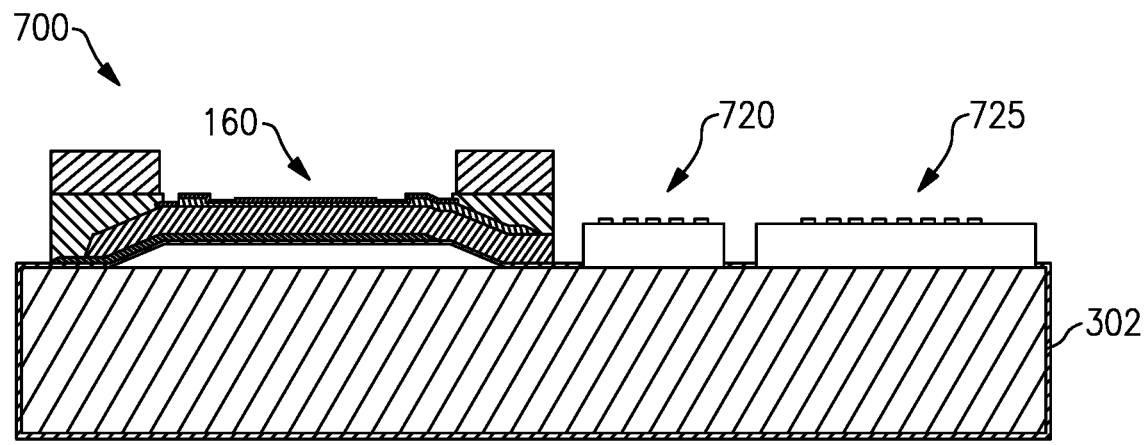
FIG. 7A is a cross sectional view of bulk acoustic wave and surface acoustic wave devices on a spinel substrate according to an embodiment.

FIG. 7A illustrates an example embodiment of an acoustic wave component 700 that includes a BAW resonator 160, a first SAW device 720, and a second SAW device 725. The illustrated acoustic wave devices 160, 720, and 725 are formed on a common substrate 302. In some instances, one or more of the acoustic wave devices may be on different surfaces of the common substrate 302. For example, acoustic wave devices can be positioned on opposing sides of the common substrate 302.

Figure 7B:
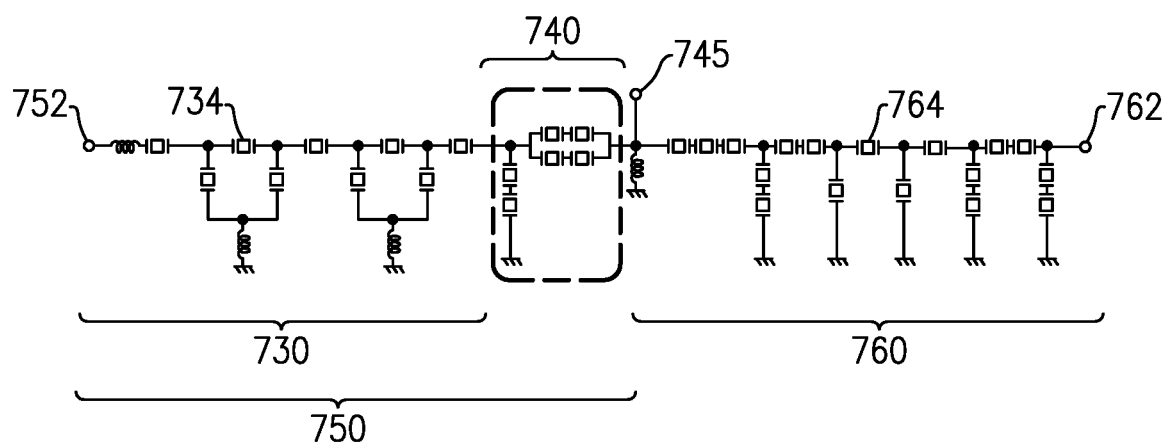
FIG. 7B is a schematic diagram illustrating bulk acoustic wave and surface acoustic wave devices of a duplexer according to an embodiment.

FIG. 7B is a schematic diagram of a duplexer that includes a transmit filter 750, a receive filter 760, a transmit port 752, a receive port 762, and an antenna port 745. The illustrated duplexer is a hybrid duplexer that includes BAW resonators and SAW resonators. By implementing BAW and SAW resonators of a duplexer on a common spinel substrate, an electrical connection line can be shorter. This can enhance performance of the duplexer and/or reduce mismatches that can result from relatively long connection lines. The transmit filter 750 includes BAW resonators with relatively high durability and SAW resonators that are relatively low cost. The BAW resonators 730 of the transmit filter 750 are coupled to the antenna node 745 by way of a SAW resonator. This can result in a harmonic improvement for the transmit filter 750.

The transmit filter 750 is coupled to the receive filter 760 at an antenna node. The duplexer of FIG. 7B can be implemented using acoustic wave resonators shown in FIG. 7A. For example, the transmit filter 750 can include BAW resonators 730 and SAW resonators 740. Some or all of the BAW resonators 730 can be implemented in accordance with any suitable principles and advantages of a BAW resonator with a spinel substrate disclosed herein. For instance, the BAW resonator 734 can be implemented by the BAW resonator 160 of FIG. 7A. Some or all of the SAW resonators 740 can be implemented on a common spinel substrate with one or more of the BAW resonators 730. For example, the one of the SAW resonators 740 can be implemented by the SAW resonator 720 of FIG. 7A. The receive filter 760 can be implemented by SAW resonators, in which one or more of the SAW resonators can be implemented on a common spinel substrate with one or more of the BAW resonators 730 and/or one or more of the SAW resonators 740. As an example, the SAW resonator 764 can be implemented by the SAW resonator 725 of FIG. 7A.

The illustrated transmit filter 750 is arranged to filter a radio frequency signal received at a transmit port 752 and provide a filtered output signal to the antenna port 745. A series inductor can be coupled between a transmit port 752 and the acoustic wave resonators of the transmit filter 750. A shunt inductor can be connected to the antenna node at which the transmit filter 750 is coupled to the receive filter 760. The transmit filter and the receive filter are both acoustic wave ladder filters in the duplexer shown in FIG. 7B. The transmit filter 750 can be a band pass filter. Any suitable number of series BAW resonators and shunt BAW resonators can be included in a transmit filter 750. The receive filter 760 may be a band pass filter. The illustrated receive filter 760 is arranged to filter a radio frequency signal received at an antenna port 745 and provide a filtered output signal to a receive port 762. Any suitable number of series resonators and shunt resonators can be included in the receive filter 760.

Figure 8:
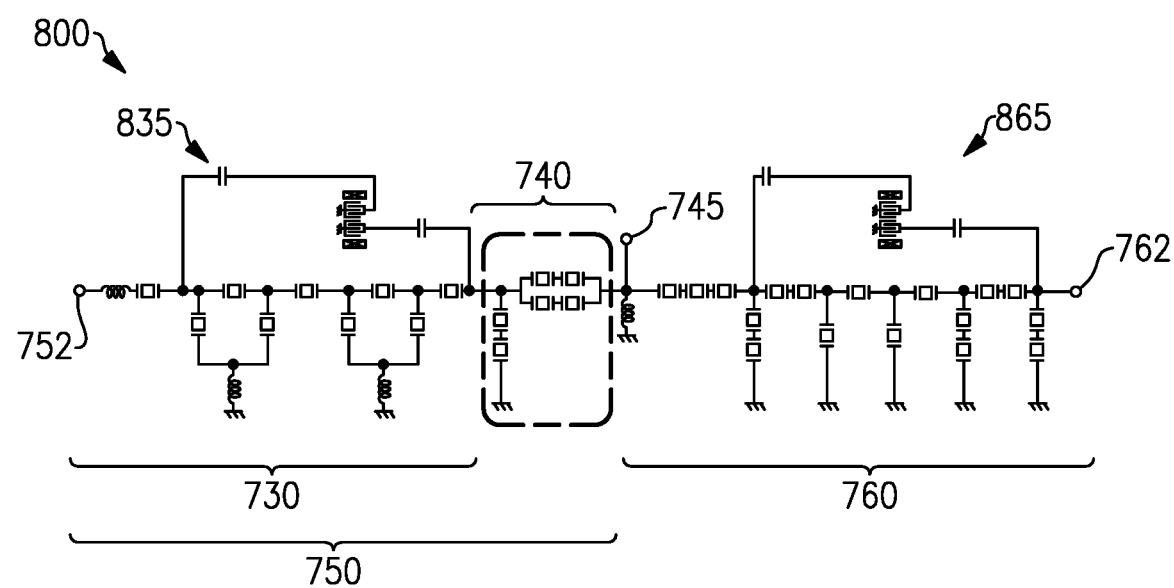
FIG. 8 is a schematic diagram illustrating a duplexer with loop circuits and acoustic wave devices according to an embodiment.

FIG. 8 is a schematic diagram of a duplexer 800 according to an embodiment. The duplexer 800 of FIG. 8 is like the duplexer of FIG. 7 except that the duplexer 800 includes a loop circuits. As illustrated, the duplexer 800 includes a transmit loop circuit 835 and a receive loop circuit 865. Some or all of the acoustic wave devices of the duplexer 800 can be implemented on a common spinel substrate.

The transmit loop circuit 835 is coupled to the transmit filter 750. The transmit loop circuit 835 can be coupled to an input resonator and an output resonator of the transmit filter 750. In some other instances, the loop circuit 835 can be coupled to a different node of the transmit filter 750 than illustrated. The loop circuit 835 can apply a signal having approximately the same amplitude and an opposite phase to a signal component to be canceled. Accordingly, the loop circuit 835 is configured to generate an anti-phase signal to a target signal at a particular frequency. The transmit loop circuit 835 can include SAW devices coupled to the transmit filter 750 by respective capacitors. The SAW devices of the loop circuit 835 can be implemented on a common spinel substrate as some or all of the BAW resonators 730 of the transmit filter 750. For example, a SAW device of the transmit loop circuit 835 can correspond to the SAW device 720 of FIG. 7A and a BAW resonator of the BAW resonators 730 can correspond to the BAW resonator 160 of FIG. 7A. The transmit loop circuit 835 can be implemented in accordance with any suitable principles and advantages described in U.S. Pat. Nos. 9,246,533 and/or 9,520,857, the disclosures of these patents are hereby incorporated by reference in their entireties herein.

The receive loop circuit 865 is coupled to the receive filter 760. The receive loop circuit 865 can generally implement any suitable features of the transmit loop circuit 835 except on the receive side. The SAW devices of the receive loop circuit 865 can be implemented on a common spinel substrate as some or all of the BAW resonators 730 of the transmit filter 750. For example, a SAW device of the receive loop circuit 865 can correspond to the SAW device 725 of FIG. 7A and a BAW resonator of the BAW resonators 730 can correspond to the BAW resonator 160 of FIG. 7A.

Figure 9:
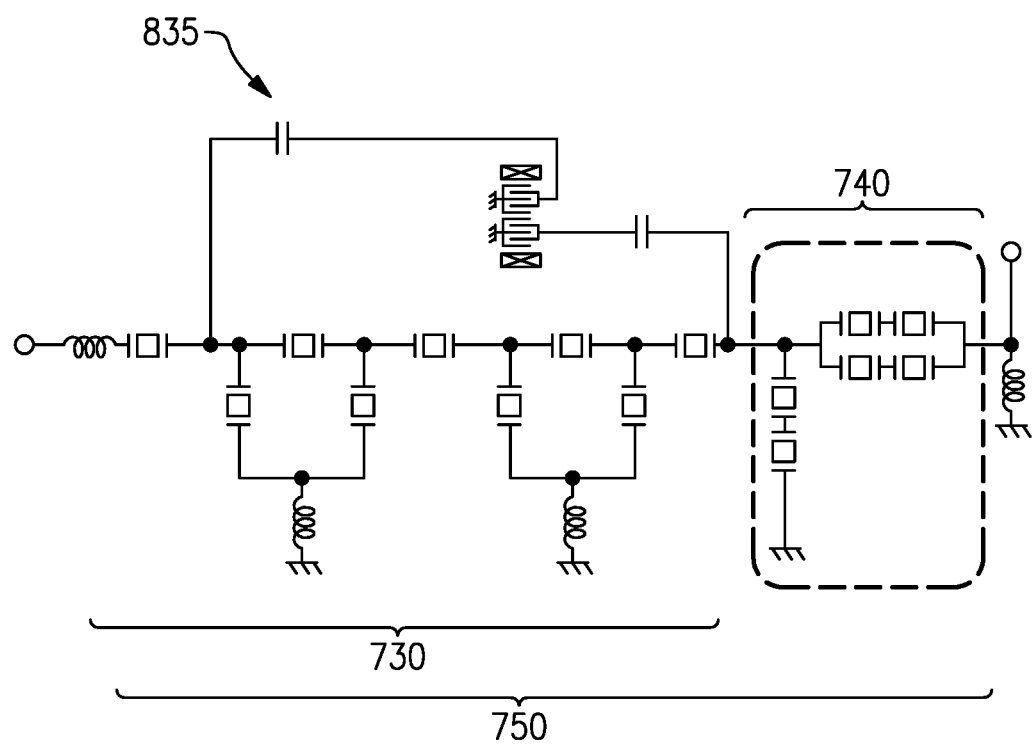
FIG. 9 is a schematic diagram of a transmit filter including a loop circuit that includes acoustic wave devices according to an embodiment.
Figure 10:
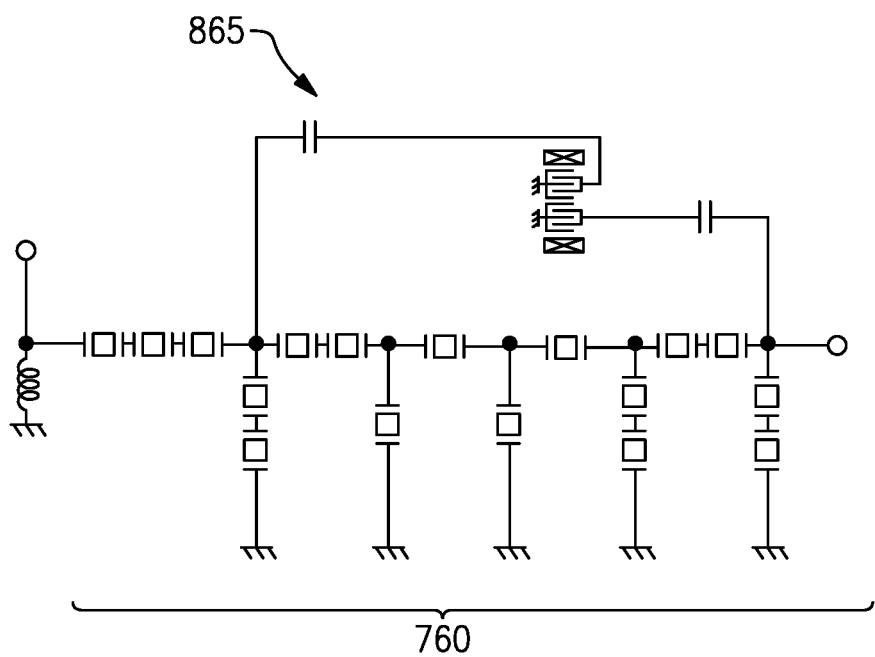
FIG. 10 is a schematic diagram of a receive filter including a loop circuit that includes acoustic wave devices according to an embodiment.

Although FIGS. 7B and 8 illustrate duplexers, any suitable principles and advantages discussed herein (e.g., with reference to FIG. 7B and/or FIG. 8) can be implemented in any other multiplexer that includes a plurality of filters coupled to a common node (e.g., a quadplexer, a hexaplexer, an octoplexer, or the like). Similarly, although FIG. 8 illustrates a duplexer with a transmit filter and a receive filter, any suitable principles and advantages of FIG. 8 and/or other embodiments disclosed herein can be implemented in a transmit filter and/or a receive filter. For example, FIG. 9 illustrates a transmit filter 750 with a loop circuit 835 according to an embodiment. As another example, FIG. 10 illustrates a receive filter 760 with a loop circuit 865 according to an embodiment.

Figure 11:
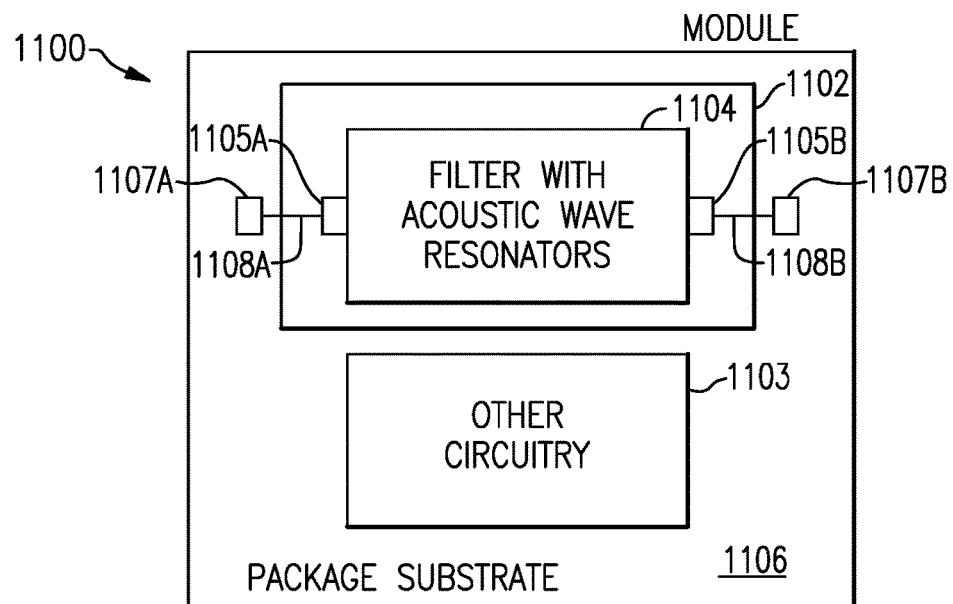
FIG. 11 is a schematic diagram of a radio frequency module that includes an acoustic wave component according to an embodiment.
Figure 12:
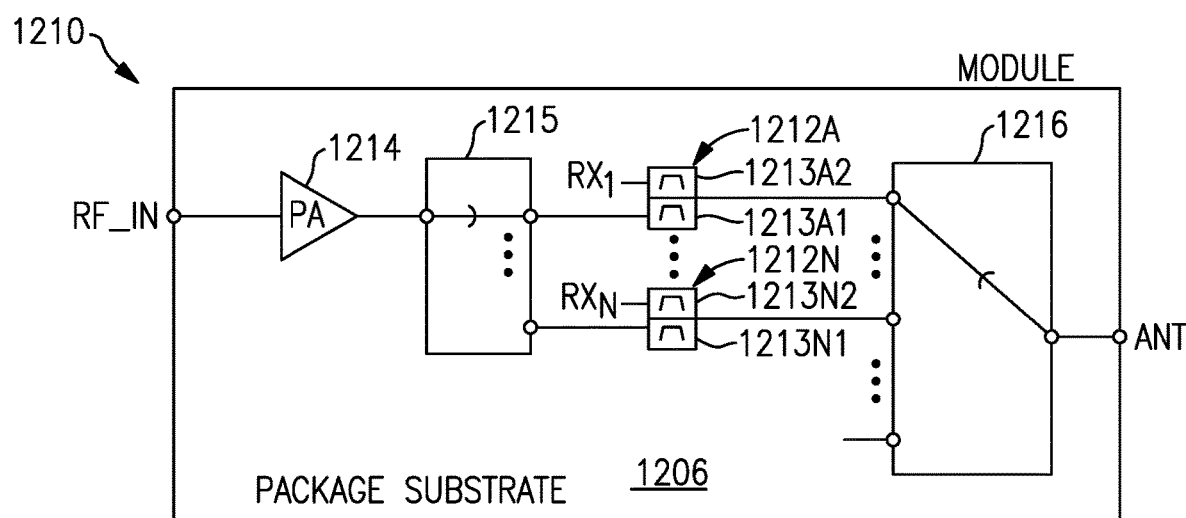
FIG. 12 is a schematic diagram of a radio frequency module that includes an acoustic wave filters according to an embodiment.

The acoustic wave resonators with a spinel substrate disclosed herein can be implemented in a variety of packaged modules. Some example packaged modules will now be discussed in which any suitable principles and advantages of the acoustic wave devices disclosed herein can be implemented. The example packaged modules can include a package that encloses the illustrated circuit elements. The illustrated circuit elements can be disposed on a common packaging substrate. The packaging substrate can be a laminate substrate, for example. FIGS. 11 and 12 are schematic block diagrams of illustrative packaged modules according to certain embodiments. Any suitable combination of features of these modules can be implemented with each other. While duplexers are illustrated in the example packaged module of FIG. 12, any other suitable multiplexer that includes a plurality of acoustic wave filters coupled to a common node can be implemented instead of one or more duplexers. For example, a quadplexer can be implemented in certain applications. Alternatively or additionally, one or more filters of a packaged module can be arranged as a transmit filter or a receive filter that is not included in a multiplexer.

An acoustic wave device (e.g., the BAW resonator or the SAW resonator) including any suitable combination of features disclosed herein can be included in a filter arranged to filter a radio frequency signal in a fifth generation (5G) New Radio (NR) operating band within Frequency Range 1 (FR1). A filter arranged to filter a radio frequency signal in a 5G NR operating band can include one or more BAW resonators and/or SAW devices disclosed herein. FR1 can be from 410 MHz to 7.125 GHz, for example, as specified in a current 5G NR specification.

A filter including one or more BAW resonators disclosed herein can achieve better harmonic performance (e.g., lower harmonic distortion and/or less intermodulation distortion) than some other BAW resonators in 5G applications. Ceramic and/or glass substrates disclosed herein can contribute to better harmonic performance than silicon substrates, particularly at relative high power and/or relatively high operating temperature. For example, ceramic and/or glass substrates can improve harmonic performance in relative high peak power operations in 5G applications and/or in operations with a relatively high average power (such as with relatively high time division duplexing transmit duty cycles) in 5G applications.

One or more acoustic wave devices in accordance with any suitable principles and advantages disclosed herein can be included in a filter arranged to filter a radio frequency signal in a 4G LTE operating band. One or more acoustic wave devices in accordance with any suitable principles and advantages disclosed herein can be included in a filter arranged to filter a radio frequency signal in a filter having a passband that includes a 4G LTE operating band and a 5G NR operating band.

FIG. 11 is a schematic diagram of a radio frequency module 1100 that includes an acoustic wave component 1102 according to an embodiment. The illustrated radio frequency module 1100 includes the acoustic wave component 1102 and other circuitry 1103. The acoustic wave component 1102 can include one or more acoustic wave resonators and/or devices with a spinel substrate in accordance with any suitable combination of features of the acoustic wave resonators disclosed herein. The acoustic wave component 1102 can include an acoustic wave die that includes acoustic wave resonator and/or devices s. For example, the acoustic wave component 1102 can include a BAW die with a spinel substrate. As another example, the acoustic wave component 1102 can include one or more BAW resonators and one or more SAW devices on a common spinel substrate.

The acoustic wave component 1102 shown in FIG. 11 includes a filter 1104 and terminals 1105A and 1105B. The filter 1104 includes acoustic wave resonators. One or more of the acoustic wave resonators can be implemented in accordance with any suitable principles and advantages of the acoustic wave resonators with a spinel substrate disclosed herein. The filter 1104 can include one or more BAW resonators arranged to filter radio frequency signals in an operating band in a range from 3.5 GHz to 13 GHz, 5 GHz to 10 GHz, or any range disclosed herein. The terminals 1105A and 1104B can serve, for example, as an input contact and an output contact. The acoustic wave component 1102 and the other circuitry 1103 are on a common packaging substrate 1106 in FIG. 11. The package substrate 1106 can be a laminate substrate. The terminals 1105A and 1105B can be electrically connected to contacts 1107A and 1107B, respectively, on the packaging substrate 1106 by way of electrical connectors 1108A and 1108B, respectively. The electrical connectors 1108A and 1108B can be bumps or wire bonds, for example.

The other circuitry 1103 can include any suitable additional circuitry. For example, the other circuitry can include one or more one or more power amplifiers, one or more radio frequency switches, one or more additional filters, one or more low noise amplifiers, one or more RF couplers, one or more delay lines, one or more phase shifters, the like, or any suitable combination thereof. The radio frequency module 1100 can include one or more packaging structures to, for example, provide protection and/or facilitate easier handling of the radio frequency module 1100. Such a packaging structure can include an overmold structure formed over the packaging substrate 1100. The overmold structure can encapsulate some or all of the components of the radio frequency module 1100.

FIG. 12 is a schematic diagram of a radio frequency module 1210 that includes an acoustic wave component according to an embodiment. As illustrated, the radio frequency module 1210 includes duplexers 1212A to 1212N that include respective transmit filters 1213A1 to 1213N1 and respective receive filters 1213A2 to 1213N2, a power amplifier 1214, a select switch 1215, and an antenna switch 1216. The radio frequency module 1210 can include a package that encloses the illustrated elements. The illustrated elements can be disposed on a common packaging substrate 1206. The packaging substrate 1206 can be a laminate substrate, for example. A radio frequency module that includes a power amplifier can be referred to as a power amplifier module. A radio frequency module can include a subset of the elements illustrated in FIG. 12 and/or additional elements. The radio frequency module 1210 may include any one of the acoustic wave devices with a spinel substrates in accordance with any suitable principles and advantages disclosed herein.

The duplexers 1212A to 1212N can each include two acoustic wave filters coupled to a common node. For example, the two acoustic wave filters can be a transmit filter and a receive filter, for example, as described with reference to FIGS. 7B and/or 8. As illustrated, the transmit filter and the receive filter can each be a band pass filter arranged to filter a radio frequency signal. One or more of the transmit filters 1213A1 to 1213N1 can include one or more acoustic wave resonators with a spinel substrate in accordance with any suitable principles and advantages disclosed herein. Similarly, one or more of the receive filters 1213A2 to 1213N2 can include one or more acoustic wave resonators with a spinel substrate in accordance with any suitable principles and advantages disclosed herein. Although FIG. 12 illustrates duplexers, any suitable principles and advantages disclosed herein can be implemented in other multiplexers (e.g., quadplexers, hexaplexers, octoplexers, etc.) and/or in switch-plexers.

The power amplifier 1214 can amplify a radio frequency signal. The illustrated switch 1215 is a multi-throw radio frequency switch. The switch 1215 can electrically couple an output of the power amplifier 1214 to a selected transmit filter of the transmit filters 1213A1 to 1213N1. In some instances, the switch 1215 can electrically connect the output of the power amplifier 1214 to more than one of the transmit filters 1213A1 to 1213N1. The antenna switch 1216 can selectively couple a signal from one or more of the duplexers 1212A to 1212N to an antenna port ANT. The duplexers 1212A to 1212N can be associated with different frequency bands and/or different modes of operation (e.g., different power modes, different signaling modes, etc.).

Figure 13A:
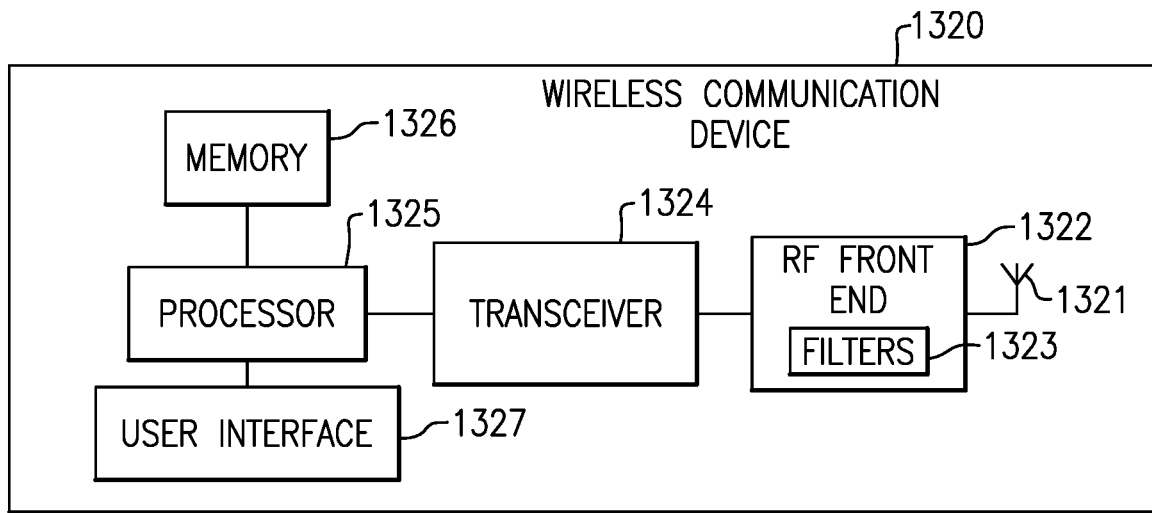
FIG. 13A is a schematic block diagram of a wireless communication device that includes a filter in accordance with one or more embodiments.

FIG. 13A is a schematic diagram of a wireless communication 1020 device that includes filters 1023 in a radio frequency front end 1022 according to an embodiment. The filters 1023 may be implemented on one or more spinel substrates as described herein. The filters 1023 can include one or more wave resonators with a spinel substrate in accordance with any suitable principles and advantages discussed herein. The wireless communication device 1020 can be any suitable wireless communication device. For instance, a wireless communication device 1020 can be a mobile phone, such as a smart phone. As illustrated, the wireless communication device 1020 includes an antenna 1021, an RF front end 1022, a transceiver 1024, a processor 1025, a memory 1026, and a user interface 1027. The antenna 1021 can transmit RF signals provided by the RF front end 1022. Such RF signals can include carrier aggregation signals. The antenna 1021 can receive RF signals and provide the received RF signals to the RF front end 1022 for processing.

The RF front end 1022 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 1022 can transmit and receive RF signals associated with any suitable communication standards. The filters 1023 can include one or more acoustic wave resonators on a spinel substrate that include any suitable combination of features discussed with reference to any embodiments discussed above.

The transceiver 1024 can provide RF signals to the RF front end 1022 for amplification and/or other processing. The transceiver 1024 can also process an RF signal provided by a low noise amplifier of the RF front end 1022. The transceiver 1024 is in communication with the processor 1025. The processor 1025 can be a baseband processor. The processor 1025 can provide any suitable base band processing functions for the wireless communication device 1020. The memory 1026 can be accessed by the processor 1025. The memory 1026 can store any suitable data for the wireless communication device 1020. The user interface 1027 can be any suitable user interface, such as a display with touch screen capabilities.

Figure 13B:
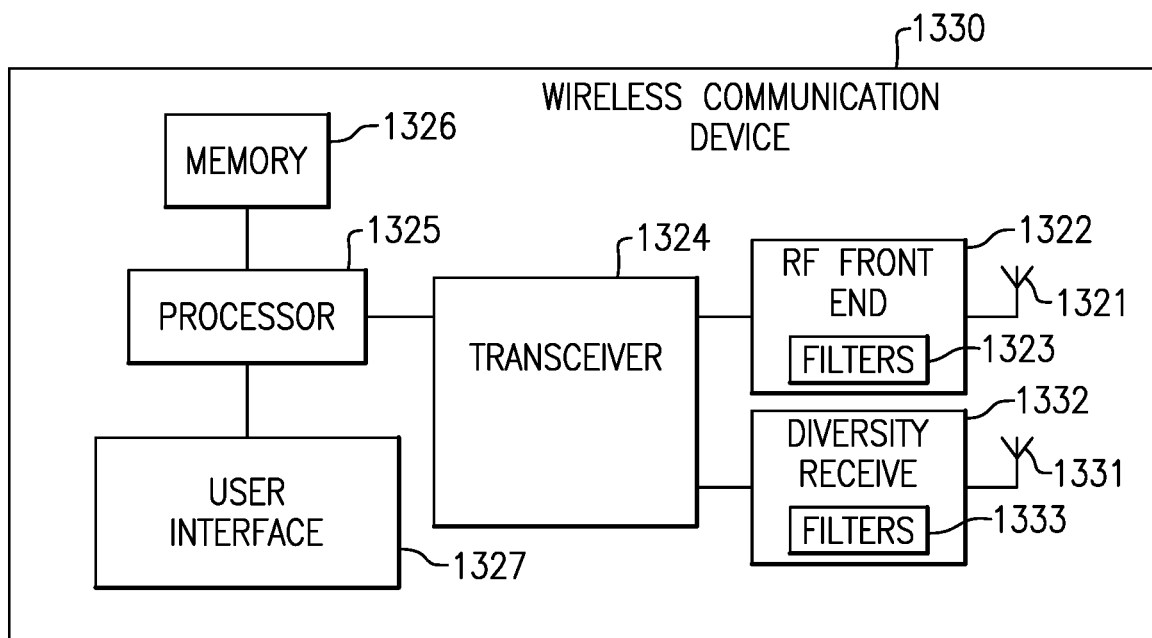
FIG. 13B is a schematic block diagram of another wireless communication device that includes a filter in accordance with one or more embodiments.

FIG. 13B is a schematic diagram of a wireless communication device 1330 that includes filters 1023 in a radio frequency front end 1022 and second filters 1333 in a diversity receive module 1332. The second filters 1023 can include one or more acoustic wave resonators on spinel substrate in accordance with any suitable principles and advantages disclosed herein. The wireless communication device 1330 is like the wireless communication device 1020 of FIG. 13A, except that the wireless communication device 1330 also includes diversity receive features. As illustrated in FIG. 13B, the wireless communication device 1330 includes a diversity antenna 1331, a diversity module 1332 configured to process signals received by the diversity antenna 1331 and including filters 1333, and a transceiver 1334 in communication with both the radio frequency front end 1022 and the diversity receive module 1332. The filters 1333 can include one or more acoustic wave resonators with a spinel substrate that include any suitable combination of features discussed with reference to any embodiments discussed above.

Any of the embodiments described above can be implemented in mobile devices such as cellular handsets. The principles and advantages of the embodiments can be used for any systems or apparatus, such as any uplink cellular device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals having a frequency in a range from about 30 kHz to 300 GHz, such as a frequency in a range from about 450 MHz to 8.5 GHz.

Aspects of this disclosure can be implemented in various electronic devices. Examples of the electronic devices can include, but are not limited to, consumer electronic products, parts of the consumer electronic products such as die and/or acoustic wave filter assemblies and/or packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave component comprising:
    a bulk acoustic wave resonator including a portion of a glass substrate, a first piezoelectric layer on the glass substrate, electrodes on opposing sides of the first piezoelectric layer, and an air cavity between the glass substrate and an electrode of the electrodes; and
    a surface acoustic wave device disposed in the air cavity a second piezoelectric layer on the glass substrate, and an interdigital transducer electrode on the second piezoelectric layer.

2. The acoustic wave component of claim 1 wherein the glass substrate is a silicate glass substrate.

3. The acoustic wave component of claim 1 wherein the bulk acoustic wave resonator includes a frame structure along an edge of an active region of the bulk acoustic wave resonator.

4. The acoustic wave component of claim 1 wherein the bulk acoustic wave resonator includes a passivation layer between the glass substrate and an electrode of the electrodes that is closest to the glass substrate.

5. The acoustic wave component of claim 1 further comprising a second surface acoustic wave device on the glass substrate positioned laterally from the bulk acoustic wave resonator.

6. The acoustic wave component of claim 1 further comprising a receive filter and a transmit filter coupled to each other at a common node, the receive filter including the surface acoustic wave device and the transmit filter including the bulk acoustic wave resonator.

7. The acoustic wave component of claim 6 wherein the transmit filter further includes another surface acoustic wave device that includes a third portion of the glass substrate.

8. The acoustic wave component of claim 6 wherein the transmit filter further includes a loop circuit configured to generate an anti-phase signal to a target signal at a particular frequency, and the loop circuit includes another surface acoustic wave device that includes a third portion of the glass substrate.

9. The acoustic wave component of claim 6 wherein the receive filter further includes a loop circuit configured to generate an anti-phase signal to a target signal at a particular frequency, and the loop circuit includes another surface acoustic wave resonator that includes a third portion of the glass substrate.

10. The acoustic wave component of claim 1 wherein the glass substrate includes an upper surface over which the first piezoelectric layer is positioned, wherein the air cavity is over the upper surface of the glass substrate.

11. The acoustic wave component of claim 1 wherein the air cavity is formed in the glass substrate.

12. A multiplexer comprising:
    a first filter including a bulk acoustic wave resonator, the bulk acoustic wave resonator including a portion of a glass substrate, a first piezoelectric layer on the glass substrate, electrodes on opposing sides of the first piezoelectric layer, and an air cavity between the glass substrate and an electrode of the electrodes; and
    a second filter coupled to the first filter at a common node, the second filter including a surface acoustic wave device disposed in the air cavity, and the surface acoustic wave device including a second piezoelectric layer on the glass substrate, and an interdigital transducer electrode on the second piezoelectric layer.

13. The multiplexer of claim 12 wherein the glass substrate is a silicate glass substrate.

14. An acoustic wave component comprising:
    a film bulk acoustic wave resonator including a portion of a glass substrate, a piezoelectric layer on the glass substrate, electrodes on opposing sides of the piezoelectric layer, and an air cavity between the glass substrate and an electrode of the electrodes; and
    another type of acoustic wave resonator disposed in the air cavity.

15. The acoustic wave component of claim 14 wherein the glass substrate is a silicate glass substrate.

16. The acoustic wave component of claim 14 wherein the other type of acoustic wave resonator is a surface acoustic wave resonator.

17. The acoustic wave component of claim 14 wherein the other type of acoustic wave resonator is a solidly mounted resonator.

18. The acoustic wave component of claim 14 further comprising a surface acoustic resonator on the glass substrate laterally positioned from the film bulk acoustic wave resonator.

19. The acoustic wave component of claim 14 wherein the bulk acoustic wave resonator includes a frame structure along an edge of an active region of the bulk acoustic wave resonator.

20. The acoustic wave component of claim 14 wherein the bulk acoustic wave resonator includes a passivation layer between the glass substrate and the electrode of the electrodes.

* * * * *